(12) United States Patent
Inoue et al.

(10) Patent No.: US 9,159,807 B2
(45) Date of Patent: Oct. 13, 2015

(54) SEMICONDUCTOR DEVICE AND MANUFACTURING METHOD THEREOF

(71) Applicant: RENESAS ELECTRONICS CORPORATION, Kawasaki-shi, Kanagawa (JP)

(72) Inventors: Komaki Inoue, Kanagawa (JP); Yutaka Hoshino, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 8 days.

(21) Appl. No.: 14/220,643

(22) Filed: Mar. 20, 2014

(65) Prior Publication Data

US 2014/0206155 A1   Jul. 24, 2014

Related U.S. Application Data

(62) Division of application No. 13/094,915, filed on Apr. 27, 2011, now abandoned.

(30) Foreign Application Priority Data

May 17, 2010   (JP) ................................. 2010-113428

(51) Int. Cl.
*H01L 21/768* (2006.01)
*H01L 29/66* (2006.01)
(Continued)

(52) U.S. Cl.
CPC ........ *H01L 29/66772* (2013.01); *H01L 21/743* (2013.01); *H01L 21/84* (2013.01); *H01L 27/1203* (2013.01); *H01L 21/76816* (2013.01); *H01L 2924/0002* (2013.01)

(58) Field of Classification Search
CPC ... H01L 21/84; H01L 21/743; H01L 27/1203; H01L 2924/00; H01L 21/31116; H01L 21/31144; H01L 21/76805; H01L 21/76816; H01L 21/76895; H01L 21/76898; H01L 29/78603

See application file for complete search history.

(56) References Cited

U.S. PATENT DOCUMENTS

| 6,372,562 B1 * | 4/2002 | Matsumoto ................... 438/164 |
| 6,603,158 B1 | 8/2003 | Kajii et al. |

(Continued)

FOREIGN PATENT DOCUMENTS

| JP | 09-223802 A | 8/1997 |
| JP | 9-312401 A | 12/1997 |

(Continued)

OTHER PUBLICATIONS

Japanese Office Action received in Japanese Application No. 2010-113428 dated Jan. 28, 2014.

*Primary Examiner* — Evan Pert
*Assistant Examiner* — Leslie Pilar Cruz
(74) *Attorney, Agent, or Firm* — Mattingly & Malur, PC

(57) ABSTRACT

The reliability of a semiconductor device including a MOSFET formed over an SOI substrate is improved. A manufacturing method of the semiconductor device is simplified. A semiconductor device with n-channel MOSFETsQn formed over an SOI substrate SB includes an $n^+$-type semiconductor region formed as a diffusion layer over an upper surface of a support substrate under a BOX film, and a contact plug CT2 electrically coupled to the $n^+$-type semiconductor region and penetrating an element isolation region, which can control the potential of the support substrate. At a plane of the SOI substrate SB, the n-channel MOSFETsQn each extend in a first direction, and are arranged between the contact plugs CT2 formed adjacent to each other in the first direction.

5 Claims, 21 Drawing Sheets

(51) Int. Cl.
*H01L 21/74* (2006.01)
*H01L 21/84* (2006.01)
*H01L 27/12* (2006.01)

(56) References Cited

U.S. PATENT DOCUMENTS

| | | | |
|---|---|---|---|
| 7,355,248 B2 | 4/2008 | Kato | |
| 8,183,630 B2 | 5/2012 | Batude et al. | |
| 2002/0045298 A1* | 4/2002 | Takahashi | 438/149 |
| 2003/0209761 A1 | 11/2003 | Yagishita | |
| 2004/0241917 A1* | 12/2004 | Schwan et al. | 438/151 |
| 2006/0255465 A1 | 11/2006 | Kishiro | |
| 2007/0090485 A1 | 4/2007 | Takao | |

FOREIGN PATENT DOCUMENTS

| | | |
|---|---|---|
| JP | 2001-044397 A | 2/2001 |
| JP | 2001-177098 A | 6/2001 |
| JP | 2006-165251 A | 6/2006 |
| JP | 2007-115971 A | 5/2007 |
| JP | 2009-302530 A | 12/2009 |

* cited by examiner

1: ELEMENT ISOLATION REGION  
Qn: n-CHANNEL MOSFET  
CT2: CONTACT PLUG  
SB: SOI SUBSTRATE

SEMICONDUCTOR DEVICE AND MANUFACTURING METHOD THEREOF

CROSS-REFERENCE TO RELATED APPLICATIONS

This application is a divisional of U.S. patent application Ser. No. 13/094,915, filed Apr. 27, 2011, which claims priority to Japanese Patent Application No. 2010-113428, filed May 17, 2010. The disclosures of these applications, including the specification, drawings and abstract, are incorporated herein by reference in their entirety.

BACKGROUND

The present invention relates to semiconductor devices using silicon on insulator (SOI) substrate, and manufacturing methods of the semiconductor devices. More particularly, the invention relates to a technique effectively applied to a semiconductor device for controlling the potential of a substrate via a silicon layer, and a manufacturing method of the semiconductor device.

Semiconductor devices with the SOI substrate have currently been used as a semiconductor device that can reduce the generation of parasitic capacitance. The SOI substrate includes a buried oxide (BOX) film formed over a support substrate comprised of Si(silicon) with a high resistance, and a thin layer (silicon layer) containing Si(silicon) as a principal component over the BOX film. The formation of a metal oxide semiconductor field-effect transistor (MOSFET) over the SOI substrate can reduce the parasitic capacitance caused in a diffusion region formed in the silicon layer. It can be expected that the use of the SOI substrate for manufacturing the semiconductor device improves the integration density and operation speed of the semiconductor device and achieves the latch-up-free structure of the semiconductor device.

In the technique disclosed in Patent Document 1 (Japanese Unexamined Patent Publication No. Hei 9 (1997)-312401), an impurity-doped polysilicon layer is formed over an upper surface of a support substrate under a silicon oxide film (BOX film) included in an SOI substrate. The potential of the impurity-doped polysilicon layer is controlled to store charges in the polysilicon layer, which suppresses variations in threshold voltage of a MOSFET. The respective impurity-doped polysilicon layers under the n-channel MOSFET and the p-channel MOSFET are of an n-conduction type. The type of impurities to be introduced into the respective impurity-doped polysilicon layers under the MOSFETs is not changed between the n-channel MOSFET and the p-channel MOSFET.

A semiconductor device using an SOI substrate which is disclosed in Patent Document 2 (Japanese Unexamined Patent Publication No. 2001-177098) has a contact plug formed through a buried oxide (BOX) film and a silicon film over the BOX film and electrically coupled to a support substrate so as to control the potential of a support substrate under the BOX film included in an SOI substrate. In this technique, the potential of the support substrate is controlled through the contact plug to thereby control a threshold voltage, which can increase the speed of operation of a MOSFET, and can also reduce the power consumption and size of the MOSFET. The support substrate under the n-channel MOSFET has a p-type well region formed therein, and the support substrate under the p-channel MOSFET has an n-type well region formed therein. A contact plug for controlling the potential of the support substrate has a columnar shape. This patent document does not disclose that the contact plug extends along a main surface of the SOI substrate.

In an active state of the n-channel MOSFET, a voltage lower than a power-supply voltage is applied to the support substrate under the n-channel MOSFET. In a standby (off) state of the n-channel MOSFET, the power-supply voltage is applied to the support substrate. On the other hand, in an active state of the p-channel MOSFET, a voltage lower than a ground voltage is applied to the support substrate under the p-channel MOSFET. In a standby (off) state of the p-channel MOSFET, the ground voltage is applied to the support substrate. This patent document does not disclose that the potential of the support substrate is set to the same level as that of a gate electrode of the n-channel or p-channel MOSFET.

In the technique disclosed in Patent Document 3 (Japanese Unexamined Patent Publication No. 2007-115971) for controlling the potential of a support substrate under a gate electrode of a MOSFET, a semiconductor device formed over an SOI substrate has a contact plug electrically coupled to the support substrate, while penetrating a BOX film and a silicon film formed over the BOX film which are included in the SOI substrate. Through the contact plug, the potential of the support substrate can be controlled. A p-type well region is formed at the support substrate under the n-channel MOSFET, while an n-type well region is formed at the support substrate under the p-channel MOSFET. The contact plug for controlling the potential of the support substrate has a columnar shape. This patent document does not disclose that the contact plug extends along a main surface of the semiconductor substrate.

A substrate bias voltage is applied to the p-type well and the n-type well under the gate electrodes of the n-channel MOSFET and the p-channel MOSFET. A voltage between the gate and substrate is controlled by the substrate bias voltage. However, this patent document does not disclose that the potential of the gate electrode is set to the same level as a support potential of the substrate.

RELATED ART DOCUMENTS

Patent Documents

[Patent Document 1]
Japanese Unexamined Patent Publication No. Hei 9(1997)-312401
[Patent Document 2]
Japanese Unexamined Patent Publication No. 2001-177098
[Patent Document 3]
Japanese Unexamined Patent Publication No. 2007-115971

SUMMARY

A MOSFET, specifically, a high frequency field-effect transistor which is used in an antenna switch for a cellular phone does not output an input signal without noise. The MOSFET has the following property (distortion property). The input signal tends to be output in the form of a mixed signal including distortion component (noise). The distortion component tends to be generated as a high-frequency wave with a wavelength twice or three times larger than that of the input signal. The distortion component is a frequency component unrelated to the inherent input signal. Such mixing of the excess frequency component into the input signal leads to a problem that the signal cannot be output with high accuracy. When the above-mentioned MOSFET is formed over a semiconductor substrate of bulk silicon mainly comprised of Si(silicon), the parasitic capacitance, such as a gate capacitance or a drain capacitance, is caused between the semiconductor substrate and a gate electrode or a drain region, which tends to generate the distortion component (which increases the distortion).

For this reason, the inventors have studied about methods for using a semiconductor substrate comprised of GaAs (gallium arsenide) or a SOS (silicon on sapphire) substrate as a semiconductor substrate for forming a high frequency MOSFET which hardly generates distortion components (with less distortion).

When the MOSFET used for switching of a high-frequency signal is formed over the SOS substrate or semiconductor substrate (hereinafter simply referred to as a GaAs substrate) comprised of GaAs (gallium arsenide), the occurrence of noise due to switching can be suppressed in the input signal and output signal to and from the high frequency MOSFET.

The reason why the use of the GaAs substrate can suppress the generation of noise is that the GaAs substrate has a high purity semiconductor layer with few impurities for easily permitting electrons to flow therethrough, thus making the moving speed of electrons high with less noise. Thus, a high electron mobility transistor (HEMT) formed over the GaAs substrate reduces the amount of noise.

The SOS substrate is a substrate including a silicon layer formed over a support substrate comprised of sapphire. The high frequency MOSFET is formed over the silicon layer located over the upper side of the SOS substrate including a sapphire layer as an insulating layer. In this case, the parasitic capacitance serving as a propagation route of noise in the input and output signals of the high frequency MOSFET is hardly generated between the substrate and a source/drain region. Thus, the amount of generated noise can be decreased.

Since these materials used for the substrate are expensive, the manufacture of the semiconductor device using the GaAs substrate or SOS substrate leads to an increase in cost of products including the semiconductor device.

The SOS substrate is a substrate including a sapphire layer which is an insulating layer, and a silicon layer formed over the sapphire layer. The SOS substrate can suppress the occurrence of a distortion component having a frequency twice larger than that of an input signal due to the parasitic capacitance between a well and the substrate. However, the SOS substrate has difficulty in suppressing the generation of distortion component with a frequency three times larger than that of the input signal due to the parasitic capacitance between the well and the source/drain region.

In contrast, the use of the SOI substrate has been proposed as a low-cost semiconductor substrate that can suppress the generation of the parasitic capacitance between the gate electrode and the semiconductor substrate. Even the SOI substrate has the distortion property that noise (distortion component) is caused due to the parasitic capacitance. The MOSFET formed over the SOI substrate has the problem of a low drain breakdown voltage between a drain and a gate. When the drain breakdown voltage is low, it is necessary to increase the size of the gate electrode, or to expand the distance between the gate electrode and the drain region, thereby ensuring a predetermined drain breakdown voltage. This interferes with the microfabrication of semiconductor elements.

Accordingly, it is an object of the present invention to improve the reliability of a semiconductor device. Specifically, the invention has an object to provide a technique for preventing the generation of a distortion component in input and output signals by suppressing the generation of the parasitic capacitance in a field-effect transistor formed over an SOI substrate.

It is another object of the present invention to simplify manufacturing processes of the semiconductor device.

The above and other objects and novel features of the invention will become apparent from the description of the present specification and the accompanying drawings.

The outline of representative aspects of the invention disclosed in the present application will be briefly described below.

A semiconductor device according to one aspect of the present invention includes a semiconductor substrate with an SOI structure which includes a support substrate, an insulating layer formed over the support substrate, and a semiconductor layer formed over the insulating layer, and a plurality of field-effect transistors of a first conduction type formed over a main surface of the semiconductor substrate to be surrounded by an element isolation region. The field-effect transistors each extend in a first direction along the main surface of the semiconductor substrate, and are arranged side by side in the first direction. One or more impurity diffusion layers having a lower resistance than that of the support substance are formed over an upper surface of the support substrate below the field-effect transistors. A plurality of metal wirings is formed above the field-effect transistors for supplying a predetermined potential to the impurity diffusion layers. The one or more impurity diffusion layers and the metal wirings are electrically coupled to each other via plurality of first connection portions formed through the insulating layer and the element isolation region between the field-effect transistors adjacent to each other in the first direction.

A manufacturing method of a semiconductor device according to another aspect of the invention is directed to the semiconductor device including a field-effect transistor formed over a semiconductor substrate with an SOI structure. The method includes the step of (a) preparing the semiconductor substrate including a support substrate, an insulating layer formed over the support substrate, and a semiconductor layer formed over the insulating layer; and (b) after the step (a), forming an element isolation region at a main surface of the semiconductor substrate. The manufacturing method also includes the steps of (c) after the step (b), forming a first impurity diffusion layer of a first conduction type with a lower resistance than that of the support substrate, over an upper surface of the support substrate by implanting impurities of the first conduction type from the main surface of the semiconductor substrate into the main surface of the semiconductor substrate; and (d) after the step (b), forming a second impurity diffusion layer of a second conduction type in the semiconductor layer by implanting impurities of the second conduction type from the main surface of the semiconductor substrate into the main surface of the semiconductor substrate. The manufacturing method further includes (e) after the steps (c) and (d), forming the field-effect transistors including a gate electrode and source/drain regions of the first conduction type over an upper surface of the semiconductor layer; and (f) after the step (e), forming a silicide layer over a surface of each of the gate electrode and the source/drain regions. The method still further includes (g) after the step (f), forming a first insulating film over the main surface of the semiconductor substrate so as to cover the main surface of the semiconductor substrate including the element isolation region, the gate electrode, the source/drain region, and the silicide layer; and (h) after the step (g), forming a second insulating film over the first insulating film. The method still further includes (i) after the step (h), forming a first contact hole for exposing an upper surface of the silicide layer located over each of the source/drain regions and the gate electrode, and a second contact hole for exposing an upper surface of the first impurity diffusion layer directly under the element isolation region by etching; and (j) after the step (i), respectively forming connection portions in the first and second contact holes. In the step (i), the first and second contact holes are formed in the same etching step.

The effects obtained by the representative aspects of the invention disclosed in the present application will be briefly described below.

The reliability of the semiconductor device can be improved.

Further, the manufacturing processes of the semiconductor device can be simplified.

DETAILED DESCRIPTION

Figure 1:
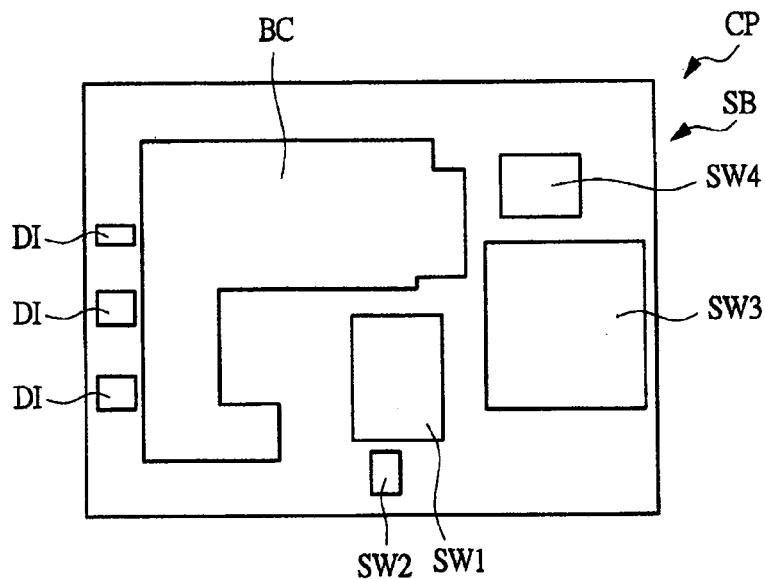
FIG. 1 is a plan view of a semiconductor device according to a first embodiment of the invention.

The following preferred embodiments may be described below by being divided into a plurality of sections or embodiments for convenience, if necessary, which are not independent from each other except when specified otherwise. One of the sections or embodiments is a modified example, the details, a supplemental explanation, or the like of a part or all of the other.

When referring to the number of elements or the like (including the number of pieces, numerical values, quantity, range, and the like) in the following description of the embodiments, the number thereof is not limited to a specific number, and may be greater than, or less than, or equal to the specific number, unless otherwise specified and except when definitely limited to the specific number in principle.

It is also needless to say that components (including elements or process steps, and the like) employed in the following description of the embodiments are not always essential, unless otherwise specified and considered to be definitely essential in principle. It goes without saying that the term "comprised of A" or "made of A" used in describing a component or the like in preferred embodiments does not exclude any element other than "element A" except when clearly demonstrating that it consists of only A.

Similarly, When referring to the shapes, positional relations and the like of the components or the like in the following description of the embodiments, they will include those substantially analogous or similar to their shapes or the like, unless otherwise specified and considered not to be definitely so in principle. This is similarly applied even to the above-described numerical values and range.

When referring to materials or the like, the specified material is a main material, and a subsidiary element, an additive, an additional element, and the like are not excluded unless otherwise specified or determined in principle or from the situation. For example, the term "silicon member" means not only a pure silicon, but also an alloy (for example, SiGe) of two or three elements which contains silicon as a principal element, and an additional impurity, and the like.

Members having the same functions are designated in principle by the same reference numeral through all drawings for explaining the following embodiments of the invention, and a repeated description thereof will be omitted.

Further, in the drawings to be used in the following embodiments, hatched areas are partly given even in plan views for easy understanding.

First Embodiment

Figure 2:
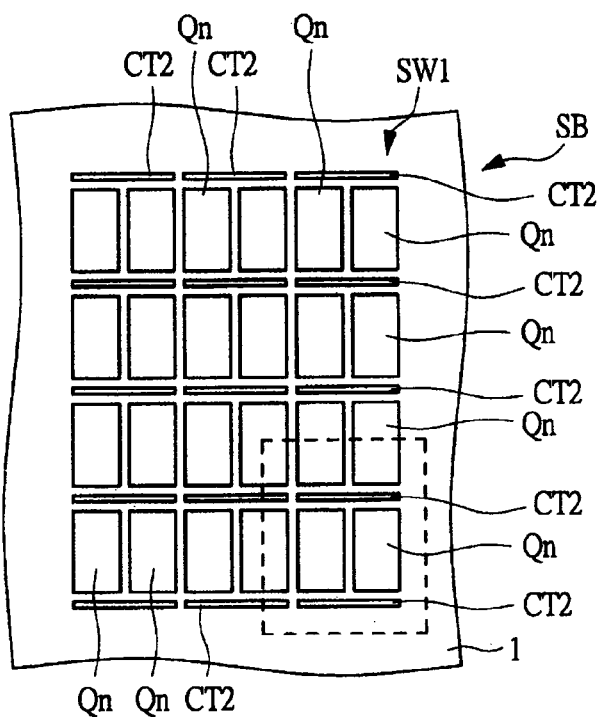
FIG. 2 is an enlarged plan view of a part shown in FIG. 1.
Figure 3:
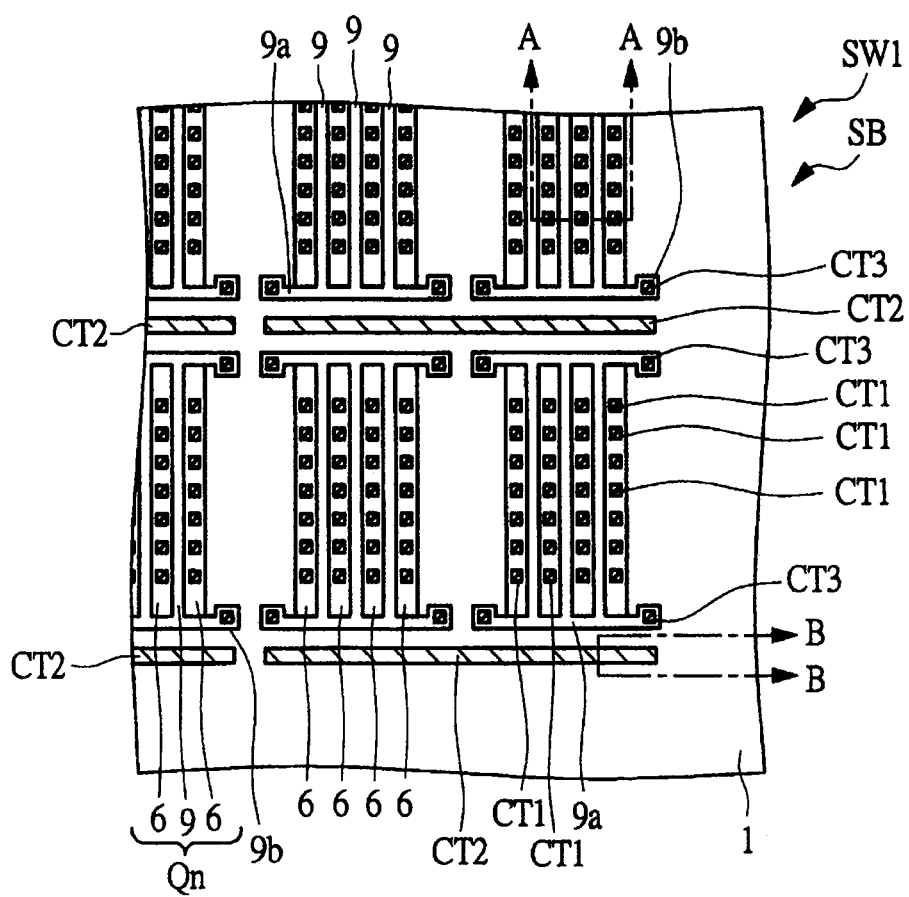
FIG. 3 is an enlarged plan view of a part shown in FIG. 2.
Figure 4:
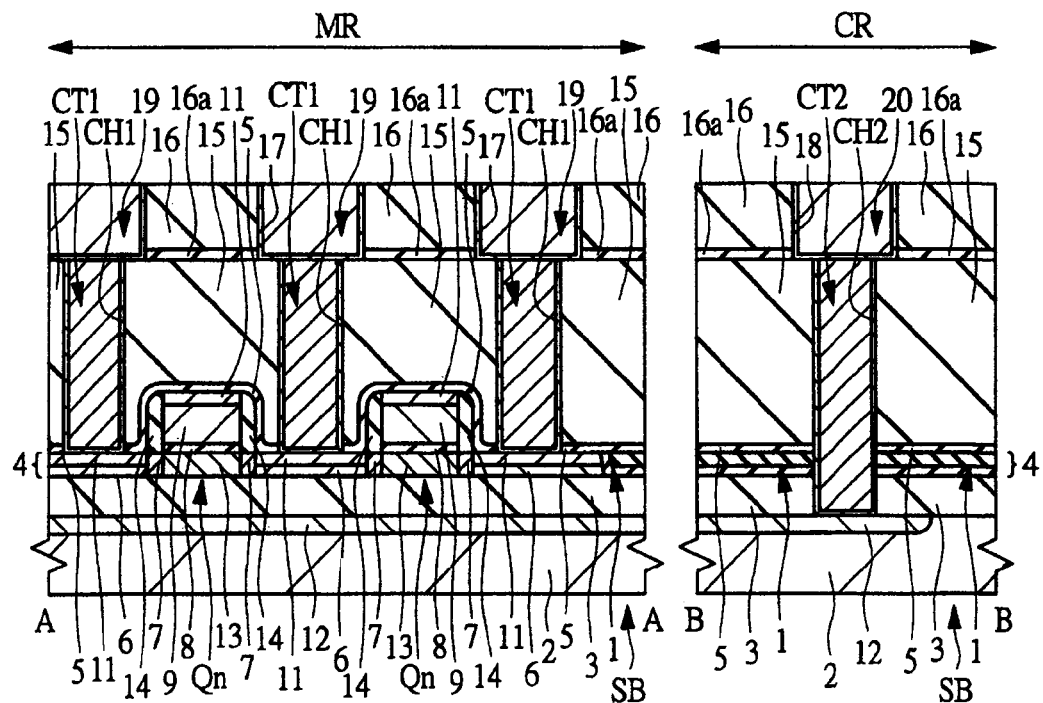
FIG. 4 is a cross-sectional view taken along the lines A-A and B-B of FIG. 3, while showing a manufacturing process of the semiconductor device according to the first embodiment of the invention.

One example of the structure of an n-channel MOSFET, which is a field-effect transistor, according to a first embodiment of the invention will be described below using FIGS. 1 to 4. FIG. 1 is a plan view showing a semiconductor chip formed over an SOI substrate. FIG. 2 is an enlarged plan view showing a switching portion SW1 shown in FIG. 1. FIG. 3 is an enlarged plan view showing a part enclosed by a broken line in FIG. 2. FIG. 4 is a cross-sectional view taken along the lines A-A and B-B of FIG. 3.

FIG. 1 shows an exemplary plan view of an entire semiconductor chip CP of this embodiment. For easy understanding, FIG. 1 does not illustrate an interlayer insulating film, a wiring, and the like formed over the semiconductor chip CP.

The semiconductor chip CP includes a SOI substrate SB, switches SW1 to SW4 including MOSFETs and wirings formed over the SOI substrate SB, a negative bias circuit BC, and electro static discharge (ESD) protection diodes DIs. The semiconductor chip CP is a switching element for switching of a high-frequency signal. The term "switching" means a switching operation of an electric circuit between ON and OFF in an AC-DC converter circuit, a digital circuit, or the like.

Each of the switches SW1 to SW4 is comprised of a plurality of MOSFETs for switching. Here, each of the switches SW1 to SW4 includes n-channel MOSFETs by way of example. The negative bias circuit BC is a circuit for using the MOSFETs formed in the switches SW1 to SW4 at correct operating points. The negative bias circuit BC serves to improve the frequency characteristics of a signal to thereby reduce distortion and noise of the signal. The switches SW1 and SW2 serve to perform switching of a signal with a relatively high frequency. The switches SW3 and SW4 serve to perform switching of a signal with a relatively low frequency. Specifically, the switches SW1 and SW3 serve to perform switching of the received signal (input signal). The switches SW2 and SW4 serve to perform switching of the transmitted signal (output signal). The ESD protection diode DI serves to prevent malfunction or breakdown of the semiconductor chip CP due to electrostatic discharge.

FIG. 2 shows an enlarged view of the switch SW1 over the semiconductor chip CP shown in FIG. 1. As shown in FIG. 2, the switch SW1 includes n-channel MOSFETsQn, an element isolation region 1, and contact plugs CT2 arranged in the matrix. The contact plug CT2 is formed through the element isolation region 1 so as to be surrounded by the element isolation region 1 over the plane of the semiconductor chip CP.

FIG. 3 shows an enlarged plan view of an area enclosed by a broken line shown in FIG. 2. As shown in FIG. 3, the n-channel MOSFETQn formed over the main surface of the SOI substrate SB is a field-effect transistor including a gate electrode 9 and source/drain regions 6 formed to sandwich each gate electrode 9 therebetween. The n-channel MOSFETsQn each extend in a first direction along the main surface of the SOI substrate SB and are arranged side by side in the first direction. Further, the n-channel MOSFETsQn are arranged side by side in a second direction perpendicular to the first direction along the main surface of the SOI substrate SB. The n-channel MOSFETsQn adjacent to each other in the second direction share the source/drain region 6. The gate electrode 9 and the source/drain region 6 respectively extend in the first direction. The source/drain region 6 is ended near the gate electrode wiring 9a extending in the second direction. The gate electrode 9 formed in the same layer as a gate electrode wiring 9a has each of both ends in the first direction coupled to the corresponding gate electrode wiring 9a. The gate electrode wiring 9a has a connection portion 9b at its end in the second direction. A contact plug CT3 is formed over the connection portion 9b. The contact plug CT3 is coupled to a wiring (not shown) formed in a layer above the gate electrode 9, the gate electrode wiring 9a, and the connection portion 9b. The gate electrode 9 is electrically coupled to the wiring via the contact plug CT3, the connection portion 9b, and the gate electrode wiring 9a. The gate electrode 9, the gate electrode wiring 9a, and the connection portion 9b are integrally formed in the same layer.

The gate electrode wirings 9a extending in the second direction are formed over the SOI substrate SB side by side in the first direction. The gate electrode 9 and the source/drain region 6 are formed between the gate electrode wiring 9a itself and another gate electrode wiring 9a adjacent to each other in the first direction. The element isolation region 1 is formed over a main surface of the SOI substrate SB under between the gate electrode wiring 9a and another gate electrode wiring 9a adjacent thereto in the first direction. As shown in FIG. 2, the element isolation region 1 is formed over the main surface of the SOI substrate SB under a space between the gate electrode wirings 9a adjacent to each other in the first direction. The element isolation region 1 has a contact plug CT2 formed through the element isolation region 1 in a direction perpendicular to the main surface of the SOI substrate SB. That is, the contact plugs CT2 are formed to sandwich the n-channel MOSFETQn therebetween in the first direction. In other words, the n-channel MOSFETQn is disposed between the contact plugs CT2 adjacent to each other in the first direction. The contact plug CT2 extends in the second direction, and is a connection portion comprised of a walled conductor and penetrating from the upper surface to the lower surface of the element isolation region 1. As shown in FIG. 4, the contact plug CT2 is electrically coupled to the support substrate 2 under a BOX (buried oxide) film 3 which is an insulating film included in the SOI substrate SB, and to a wiring 20 formed in a layer above the main surface of the SOI substrate SB.

FIG. 4 shows on its left side a cross-sectional view of a MOSFET formation region MR, which is taken along the line A-A of FIG. 3, and on its right side a cross-sectional view of a substrate connection region CR, which is taken along the line B-B of FIG. 3. In the MOSFET formation region MR, as shown in FIG. 4, the n-channel MOSFETsQn are formed over the SOI substrate SB including the support substrate 2, the BOX film 3, and the silicon layer 4. The n-channel MOSFETQn includes the source/drain regions 6 formed to sandwich therebetween a p-type well 13 formed in the silicon layer 4, an extension region 7 formed between the source/drain region 6 and the p-type well 13, and the gate electrode 9 formed over the p-type well 13 via a gate insulating film 8. A silicide layer 11 with a low resistance containing $CoSi_2$ (cobalt silicide) as a principal component is formed over the gate electrode 9 and the source/drain regions 6.

A thin insulating film 5 is formed over the SOI substrate SB, the gate electrode 9, and sidewalls 14 formed over side walls of the gate electrode 9. An interlayer insulating film 15 thicker than the insulating film 5 is formed over the insulating film 5. A contact hole CH1 is formed in the source/drain region 6 from an upper surface of the interlayer insulating film 15 through a lower layer of the insulating film 5 to expose an upper surface of the region 6. Further, the contact plug CT1 is formed in the contact hole CH1 to electrically couple the source/drain region 6 to a wiring 19 formed in a layer above the upper surface of the SOI substrate SB. The contact plug CT1 has a columnar shape. As shown in FIG. 3, the contact plugs CT1 are arranged over the source/drain regions 6 side by side in the first direction. As shown in FIG. 4, an interlayer insulating film 16 is formed over the interlayer insulating film 15. The interlayer insulating film 16 includes trenches 17 each of which exposes the upper surface of the contact plug CT1, while penetrating from the upper surface to the lower surface of the interlayer insulating film 16. A wiring 19 is formed in the trench 17 to be electrically coupled to the contact plug CT1. The wiring 19 is a metal wiring for supplying a predetermined potential to the source/drain region 6.

As shown in FIG. 4, the source/drain region 6 is formed from the upper surface to the lower surface of the silicon layer 4. Thus, the p-type well 13 is in a channel formation region under the n-channel MOSFETQn, which is a region sandwiched between the source/drain regions 6 under the gate electrode 9. During operation of the n-channel MOSFETQn, the p-type well 13 becomes a fully depleted type because a depletion layer extends from the upper surface to the lower surface of the p-type well 13.

The fully-depleted n-channel MOSFETQn can effectively prevent the generation of parasitic capacitance between the gate electrode 9 or source/drain region 6 and the p-type well 13, thus improving the operating speed of the n-channel MOSFETQn to thereby reduce power consumption and noise (distortion component), as compared to a partially depleted n-channel MOSFET in which a depletion layer does not reach the lower surface of the p-type well 13.

As shown in FIG. 3, the switch SW1 includes a plurality of n-channel MOSFETsQn formed over the main surface of the SOI substrate SB in the matrix. Contact plugs CT2 extending in the second direction are formed between the n-channel MOSFETsQn adjacent to each other in the first direction. The contact plugs CT2 are arranged side by side in the second direction. The contact plugs CT2 are also respectively formed in the vicinity of both ends in the first direction of the n-channel MOSFETQn located at the farthest end in the first direction within the switch SW1. That is, the contact plugs CT2 are arranged side by side in the first and second directions, and the n-channel MOSFETsQn are disposed between the contact plugs CT2 adjacent to each other in the first direction.

In other words, the switch SW1 includes the contact plugs CT2 arranged over the upper surface of the SOI substrate SB in the matrix. The n-channel MOSFETQn is formed between the contact plugs CT2 formed side by side in the first direction.

The contact plugs CT2 are formed not continuously but discontinuously from the vicinity of one end of the switch SW1 in the second direction to the vicinity of the other end thereof so as to prevent resist fall and generation of stress in the contact plug CT2. If a long pattern intends to be continuously formed from the vicinity of one end of the switch SW1 to the vicinity of the other end thereof, a photoresist film continuously extending long needs to be formed as a mask in forming the pattern. Since such a long photoresist film may be highly possibly broken, it is necessary to prevent the fall of the photoresist film (resist fall) by discontinuously forming the pattern to be desired. The contact plug CT2 is comprised of metal, such as W (tungsten). If a long contact plug CT2 intends to be continuously formed from the vicinity of one end of the switch SW1 to the vicinity of the other end thereof, the high stress will be generated in the metal forming the contact plug CT2. Thus, it is necessary to prevent the generation of stress by dividing the pattern to be formed into a plurality of parts. In this embodiment, the contact hole CH2 is formed in a groove shape extending in the second direction, and in a walled shape extending in the second direction, so that the potential of the support substrate 2 can be more easily controlled to thereby effectively reduce the parasitic capacitance generated in the semiconductor device.

In the MOSFET formation region MR and the substrate connection region CR shown in FIG. 4, an $n^+$-type semiconductor region 12 into which n-type impurities (for example, P (phosphorus)) are introduced in a high concentration is formed over the upper surface of the support substrate 2. As shown in FIG. 4, the MOSFET formation region MR is distinguished from the substrate connection region CR. However, the $n^+$-type semiconductor region 12 formed under the n-channel MOSFETQn in the MOSFET formation region MR is continuously formed with the $n^+$-type semiconductor region 12 in the substrate connection region CR. And, the $n^+$-type semiconductor region 12 in the MOSFET formation region MR and the $n^+$-type semiconductor region 12 in the substrate connection region CR are in the same layer, and thus are electrically coupled to each other. The $n^+$-type semiconductor region 12 is coupled to a lower surface of the contact plug CT2 in the substrate connection region CR, and is electrically coupled to the wiring 20 via the contact plug CT2. That is, the contact plug CT2 penetrates from the upper surface to the lower surface of the interlayer insulating film 15, from the upper surface to the lower surface of the insulating film 5, from the upper surface to the lower surface of the element isolation region 1, and from the upper surface to the lower surface of the BOX film 3. The contact plug CT2 has a bottom thereof coupled to the upper surface of the $n^+$-type semiconductor region 12. The interlayer insulating film 16 is formed over the interlayer insulating film 15. The interlayer insulating film 16 includes a trench 18 which penetrates from the upper surface to the lower surface of the interlayer insulating film 16 to expose the upper surface of the contact plug CT2. The wiring 20 is formed in the trench 18 to be electrically coupled to the contact plug CT2. The element isolation region 1 in this embodiment is formed by a shallow trench isolation (STI) method. The wiring 20 is a metal wiring for supplying a predetermined potential to the $n^+$-type semiconductor region 12.

As not shown in FIG. 4, referring to FIG. 3, the silicide layer 11 (not shown) is also formed over an upper surface of the connection portion 9b coupled to the gate electrode 9. An upper surface of the silicide layer 11 over the connection portion 9b is electrically coupled to the contact plug CT3. That is, the insulating film 5 is not formed between a lower surface of the contact plug CT3 and the connection portion 9b.

As shown in FIG. 4, the support substrate 2 is a semiconductor layer with a high resistance of 750 Ωcm or more, and comprised of a layer containing Si (silicon) as a principal component with oxygen or the like introduced thereinto. The SOI substrate SB includes the support substrate 2, together with the BOX film 3 formed over the support substrate 2 and comprised of $SiO_2$ (silicon oxide), and the silicon layer 4 formed over the BOX film 3 and containing Si(silicon) as a principal component. The formation of the support substrate 2 using a high-resistance material is to prevent a signal (current) flowing through the semiconductor chip CP (see FIG. 1) from flowing out of the support substrate 2.

The p-type well 13 is a semiconductor region into which p-type impurities (comprised of, for example, B (boron)) are introduced, and becomes a channel region of the n-channel MOSFET. The extension region 7 and the source/drain region 6 adjacent to the extension region 7 are semiconductor regions into which n-type impurities (comprised of, for example, P (phosphorus)) are introduced. The source/drain region 6 has the n-type impurities (comprised of, for example, P (phosphorus)) introduced thereinto in a concentration higher than that in the extension region 7. The extension region 7 and the source/drain region 6 form a lightly doped drain (LDD) structure. The source/drain regions 6 serve as a source and a drain of the n-channel MOSFETQn in this embodiment. The gate insulating film 8 is an insulating film comprised of $SO_2$ (silicon oxide), and the gate electrode 9 is a film comprised of polysilicon. The gate electrode 9 serves as a gate of the n-channel MOSFETQn in this embodiment.

The silicide layer 11 includes $CoSi_2$ (cobalt silicide) as a principal component, and mainly serves to reduce a contact resistance with the contact plug CT1 including W (tungsten) as a principal component. The silicide layer 11 may be formed of, not only cobalt silicide, but also titanium silicide, nickel silicide, or platinum silicide. Each of the interlayer insulating films 15 and 16 and the sidewalls is an insulating film comprised of, for example, $SiO_2$ (silicide oxide). The insulating film 5 is comprised of SiN (silicon nitride), and serves to prevent the excessive etching of the upper surface of the connection portion 9b (see FIG. 3) and the upper surface of the source/drain region 6 in forming the contact hole CH1. Like the contact plug CT1, the contact plug CT2 is comprised of W (tungsten), and the wirings 19 and 20 are metal wiring formed of, for example, Cu (copper) as a principal component by a damascene method. In this embodiment, the wirings 19 and 20 are produced by using the damascene method, but are not limited thereto, and may be an aluminum wiring formed by patterning using a photoresist film.

In the vertical direction with respect to the main surface of the SOI substrate SB, the BOX film 3 has a thickness of about 400 nm, the silicon layer 4 has a thickness of about 65 nm, and the interlayer insulating film 15 has a thickness of about 750 nm. That is, the contact plug CT1 has a length of about 0.75 μm in the direction with respect to the main surface of the SOI substrate SB, and the contact plug CT2 has a length of about 1.2 μm in the same direction.

Now, the effects of the semiconductor device according to this embodiment will be described below.

The semiconductor device of this embodiment includes the n-channel MOSFETQn to be used for switching of a high-frequency signal by using the SOI substrate SB shown in FIG. 4. The switching is to switch between on and off of an electric circuit in an AC-DC converter circuit, a digital circuit, or the like. At this time, in a transient state where switching is performed, high-frequency wave is generated in the semiconductor chip, which causes noise (distortion component). The noise is called "switching noise", which tends to be caused in the digital circuit where transistors serve to perform switching. As the switching is performed at a higher frequency, the speed of response can become higher, or the size of a passive element can be reduced. However, the higher the switching speed, the more the switching noise, which needs reliable measures against noise. One basic method for suppressing the generation of switching noise includes absorbing a high-frequency wave component by inserting a coil, a resistor, a capacitor, or the like into the circuit.

Another method for suppressing generation of noise due to switching includes using a substrate (GaAs substrate) comprised of GaAs (gallium arsenide) as a semiconductor substrate serving as a substrate of the chip. A further method includes using an SOS substrate as the semiconductor substrate.

The GaAs substrate has a high purity semiconductor layer which easily permits electrons to flow therethrough and which has few impurities, thus increasing the moving speed of electrons with less noise. Thus, the transistor (HEMT) formed over the GaAs substrate reduces the amount of generated noise.

The SOS substrate is a substrate having a silicon layer over the support substrate comprised of sapphire. When manufacturing the semiconductor device using the SOS substrate, the elements or the like including MOSFET are formed over the silicon layer above the upper surface of the SOS substrate. Parasitic capacitance serving as a propagation route of noise is hardly caused in the SOS substrate, which makes the amount of noise generated less.

Since these materials used for the substrates are expensive, the manufacture of the semiconductor device using the GaAs substrate or SOS substrate leads to an increase in cost of products using the semiconductor device.

The SOS substrate is a substrate including a silicon layer formed over a sapphire layer serving as an insulating layer. The SOS substrate can suppress the generation of a distortion component having a frequency twice larger than that of an input signal due to the parasitic capacitance between the well and the substrate. However, the SOS substrate has difficulty in suppressing the generation of distortion component with a frequency three times larger than that of the input signal due to the parasitic capacitance between the well and the source/drain.

In contrast, the SOI substrate is a low-cost semiconductor substrate which can prevent the generation of the parasitic capacitance between the semiconductor substrate and the gate electrode or source/drain region. The MOSFET formed over the SOI substrate has the distortion property that noise (distortion component) is generated in the input and output signals when the high-frequency signal is input into the MOSFET. And, the MOSFET has the problem of the low drain breakdown voltage, which is a breakdown voltage between the drain and gate.

Thus, the inventors have studied that the potential of the support substrate 2 under the BOX film 3 is controlled by the contact plug CT2 electrically coupled to the upper surface of the support substrate 2 of the SOI substrate SB, as illustrated by the substrate connection region CR in FIG. 4. In this embodiment, in order to obtain a potential of the high resistance support substrate, n-type impurities (comprised of, for example, P (phosphorus)) are introduced into the upper surface of the support substrate 2 in a high concentration to thereby form an $n^+$-type semiconductor region 12 having a lower resistance than that of the support substrate 2. This enables the control of the potential of the support substrate 2. That is, the semiconductor device of this embodiment is the semiconductor chip CP (see FIG. 1) having the n-channel MOSFETQn formed over the SOI substrate SB (SOI substrate SB). The $n^+$-type semiconductor region 12, which is an n-type semiconductor region like the source/drain region 6 of the n-channel MOSFETQn, is formed over the upper surface of the support substrate 2. The $n^+$-type semiconductor region 12 is electrically coupled to the wiring 20 via the contact plug CT2.

The SOI substrate is a substrate including the support substrate containing Si (silicon) as a principal component, the BOX film formed as an insulating film over the support substrate, and the silicon layer formed over the BOX film. When the MOSFET is formed over the SOI substrate, the parasitic capacitance between the semiconductor substrate and the gate electrode or source/drain region can be significantly reduced as compared to the case of forming the MOSFET over a substrate (bulk silicon substrate) comprising Si(silicon) as a principal component.

With the increased dependence on the voltage of the parasitic capacitance of the MOSFET in an off time, the distortion component is increased. Thus, by applying the same voltage to the gate electrode 9 and the support substrate 2 shown in FIG. 4, the gate electrode 9 and the support substrate 2 are set to the same potential, whereby the parasitic capacitance between the gate electrode and the support substrate can be ideally constantly kept to zero (0). In this embodiment, the potential of the support substrate 2 is controlled by coupling the contact plug CT2 to the support substrate 2, which can further reduce the parasitic capacitance generated over the SOI substrate SB, especially, between the gate electrode 9 and the support substrate 2. Thus, preferably, a gate wiring (not shown) formed in the same layer as the wirings 19 and 20 and electrically coupled to the gate electrode 9 is electrically coupled to the wiring 20, and the gate electrode 9 and the support substrate 2 are set to the same potential. As mentioned above, the distortion component is transmitted when the parasitic capacitance works as the propagation route. Thus, the occurrence of the distortion component can be prevented in the input signal and the output signal by preventing the occurrence of the parasitic capacitance in the n-channel MOSFET.

The breakdown voltage characteristics of the MOSFET formed over the semiconductor substrate are known to depend on the potential of the backside of the semiconductor substrate (substrate potential). In this embodiment, the drain breakdown voltage of the n-channel MOSFETQn can be improved by controlling (fixing) the potential of the support substrate 2 under the gate electrode 9, as compared to the case where the potential of the support substrate 2 is set to the ground potential. That is, the breakdown voltage between the gate electrode 9 and the source/drain region 6 can be enhanced. Since variations in substrate potential can be suppressed, variations in drain breakdown voltage can also be prevented.

Thus, the drain breakdown voltage is improved, which can decrease a distance between the gate and drain to reduce the size of the gate electrode 9 shown in FIG. 4. As a result, the entire n-channel MOSFETQn can be made smaller. Microfabrication of the n-channel MOSFETQn can reduce an on resistance of the n-channel MOSFET.

As mentioned above, the semiconductor device of this embodiment is manufactured using the SOI substrate SB, which can reduce cost of products including the semiconductor device. The potential of the support substance 2 is controlled while using the SOI substrate SB, so that the generation of parasitic capacitance between the gate electrode 9 and the support substance 2 can be prevented to thereby suppress the generation of the distortion component. The improvement of the breakdown voltage of the n-channel MOSFETQn decreases the on resistance and the semiconductor device is made smaller or finer, which can improve the performance of the semiconductor device.

In this embodiment, as shown in FIGS. 2 and 3, only the contact plugs CT2 extending not in the first direction in which the n-channel MOSFETQn extends, but in the second direction are formed. This is based on the following reason. If the contact plugs CT2 extending in the first direction are formed in the region with the switch SW1 formed therein as shown in FIG. 2, new contact plugs CT2 are to be formed between the n-channel MOSFETsQn adjacent to each other in the second direction so as to control the potential of the support substrate 2 near the n-channel MOSFETsQn. In this case, an element area becomes large as compared to the semiconductor device of this embodiment.

Next, manufacturing processes of the semiconductor device of this embodiment will be described below with reference to the accompanying drawings. FIGS. 5 to 14 are cross-sectional views of manufacturing processes of the semiconductor device according to one embodiment of the invention, for example, the semiconductor device with the n-channel MOSFET. The left region represented by reference character MR in each of FIGS. 5 to 14 corresponds to a cross-sectional view of the semiconductor device in the manufacturing process in the same position as that in the cross-sectional view taken along the line A-A of FIG. 3. The left region shown is the MOSFET formation region where the source/drain region, gate electrode, and channel of the n-channel MOSFET are formed. The right region represented by reference character CR in each of FIGS. 5 to 14 corresponds to a cross-sectional view of the semiconductor device in the manufacturing process in the same position as that in the cross-sectional view taken along the line B-B of FIG. 3. The right region shown is the substrate connection region for obtaining a potential of the support substrate.

Figure 5:
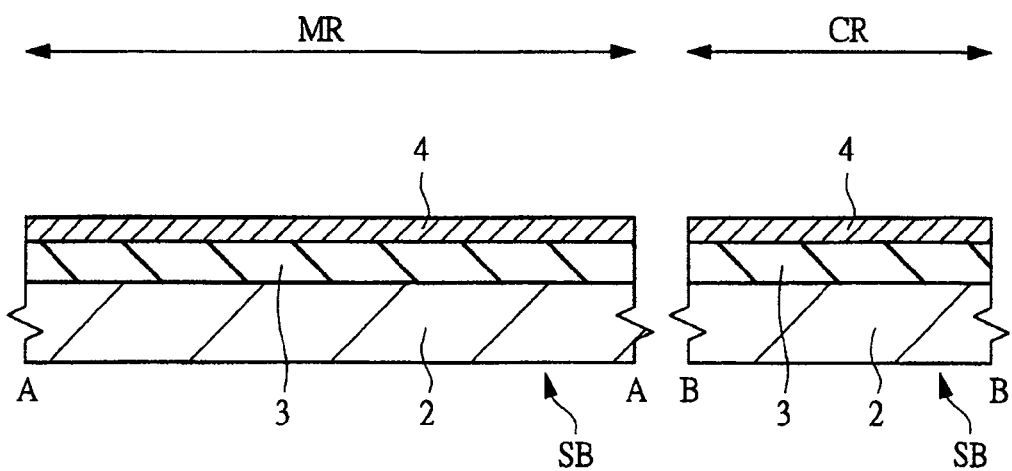
FIG. 5 is a cross-sectional view showing a manufacturing process of the semiconductor device following the process shown in FIG. 4.

First, as shown in FIG. 5, the SOI substrate SB is prepared. The SOI substrate SB is a semiconductor substrate including a BOX (buried oxide) film 3 formed over the support substrate 2 having a high resistance and comprised of Si (silicon), and the silicon layer 4 formed over the BOX film 3. The support substrate 2 is a layer having a high resistance of 750 Ωcm or more, and formed by introducing oxygen or the like into a layer including Si (silicon) as a principal component. The silicon layer 4 is a layer comprised of a monocrystal silicon or the like having a resistance of about 1 to 10 Ωcm.

The SOI substrate SB can be formed by a silicon implanted oxide (SIMOX) method which involves ion-implanting $O_2$ (oxygen) into the main surface of the semiconductor substrate comprised of Si (silicon) with high energy, and bonding the oxygen with Si (silicon) by the following heat treatment to thereby form an oxide film (BOX film) in a position slightly deeper than the surface of the semiconductor substrate. Alternatively, the SOI substrate SB can be formed by bonding and attaching one semiconductor substrate with an oxide film formed thereover to the other semiconductor substrate comprised of Si (silicon) with high heat and pressure, and polishing one side of the silicon layer to make the substrate thinner.

Figure 6:
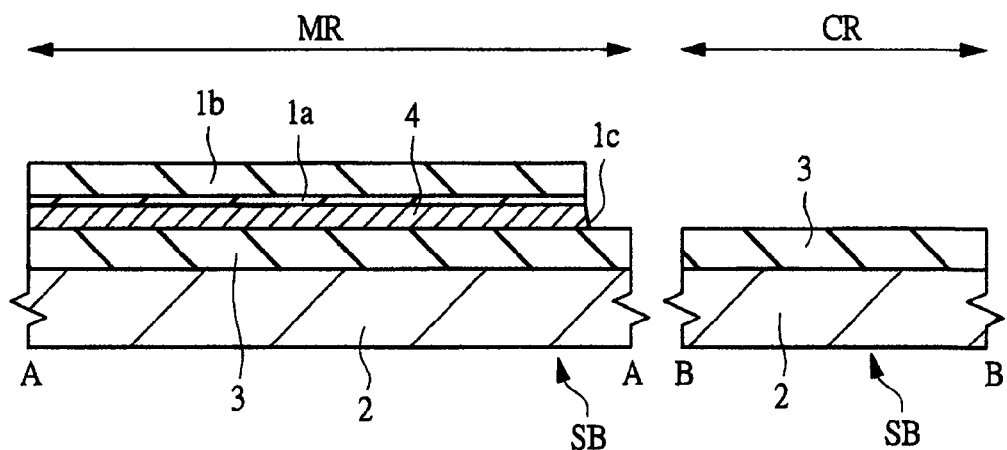
FIG. 6 is a cross-sectional view showing a manufacturing process of the semiconductor device following the process shown in FIG. 5.

Then, as shown in FIG. 6, the SOI substrate SB is thermally-oxidized to form an insulating film 1a over the surface of the substrate. Thereafter, another insulating film 1b is deposited over the insulating film 1a by a CVD method or the like. The insulating film 1a is comprised of silicon oxide or the like, and the insulating film 1b is comprised of silicon nitride or the like. Subsequently, the insulating film 1b, the insulating film 1a, and the silicon layer 4 are sequentially dry-etched using a photoresist pattern (not shown) as an etching mask to form a trench (trench for element isolation) 1c in the SOI substrate SB in the element isolation formation region. The trench 1c is a trench for element isolation, that is, a trench for formation of the element isolation region 1 to be described later.

Figure 7:
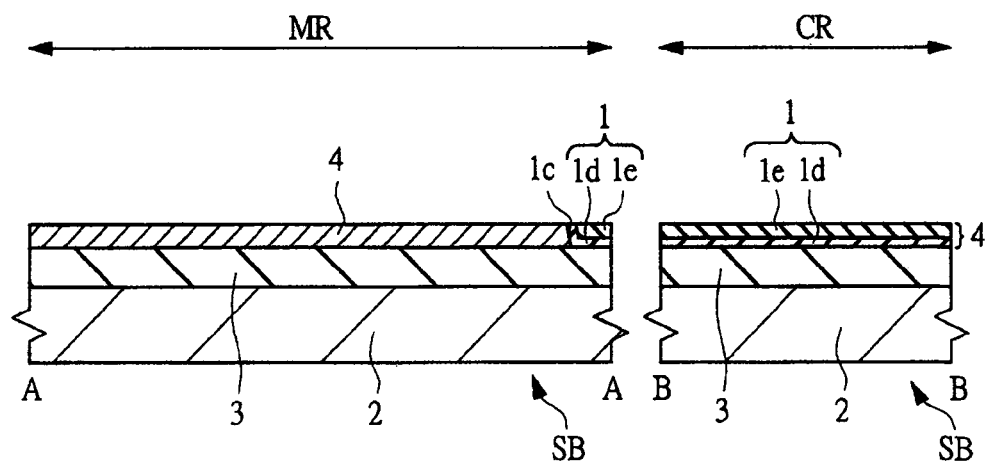
FIG. 7 is a cross-sectional view showing a manufacturing process of the semiconductor device following the process shown in FIG. 6.

Then, as shown in FIG. 7, after removing the insulating film 1b by wet etching using thermal phosphoric acid or the like, an insulating film 1d is formed over the main surface of the SOI substrate SB including the inside of the trench 1c (side walls and bottom). Thereafter, an insulating film 1e is formed (deposited) over the main surface (that is, insulating film 1d) of the SOI substrate SB by the CVD method so as to fill the trench 1C therewith. The insulating film 1d is comprised of a silicon oxide film or silicon oxynitride film. When the insulating film 1d is a silicon oxynitride film, the thermal treatment after the formation step of the insulating film 1d can prevent the volume expansion which may be caused by the oxidation of the side walls of the trench 1c. Thus, the compression stress working on the SOI substrate SB can be effectively reduced. The insulating film 1e is a silicon oxide film or $O_3$-TEOS oxide film deposited by a high density plasma CVD (HDP-CVD) method. The $O_3$-TEOS oxide film is a silicon oxide film formed by the thermal CVD method using $O_3$ (ozone) and Tetraethoxysilane (TEOS, which is also called a tetra ethyl ortho silicate) as raw material gas (source gas). When the insulating film 1e is a silicon oxide film deposited by the HDP-CVD method, the insulating film 1d can prevent damage on the SOI substrate SB in deposition of the insulating film 1e. Thereafter, the insulating film 1e and the insulating film 1d are polished by a chemical mechanical polishing (CMP) method to remove a part of the insulating film 1e outside the trench 1c and to leave parts of the insulating films 1d and 1e within the trench 1c, thus forming the element isolation (element separation) region 1 comprised of the insulating films 1d and 1e. Then, the SOI substrate SB is subjected to the heat treatment, for example, at a temperature of about 1150° C., so that the insulating film 1e embedded in the trench 1c is subjected to densification. Before the densification, the silicon oxide film deposited by the HDP-CVD method is denser than the $O_3$-TEOS oxide film. Thus, when the insulating film 1e is the $O_3$-TEOS oxide film, the contraction of the insulating film 1e in the densification can effectively reduce the compression stress acting on the SOI substrate SB. When the insulating film 1e is a silicon oxide film deposited by the HDP-CVD method, the contraction degree of the insulating film 1e during the densification is less than the insulating film 1e comprised of the $O_3$-TEOS oxide film. The element isolation region 1 increases the contraction stress acting on the SOI substrate SB.

In this way, the element isolation region 1 comprised of the insulating films 1d and 1e embedded in the trench 1c is formed. In this embodiment, the element isolation region 1 is formed not by the local oxidization of silicon (LOCOS) method, but by the STI method. That is, preferably, the element isolation region 1 of this embodiment is comprised of an insulator (here, the insulating films 1d and 1e) embedded in the trench 1c for element isolation formed over the SOI substrate SB. The above-mentioned n-channel MOSFETQn (that is, the gate insulating film 8, the gate electrode 9, and the source/drain region 6 which form the n-channel MOSFETQn) is formed in an active region defined (surrounded) by the element isolation region 1. Although in this embodiment the insulating film 1d and the insulating film 1e are shown as the element isolation region 1, the insulating film 1d may be omitted, and only the insulating film 1e may be formed.

Figure 8:
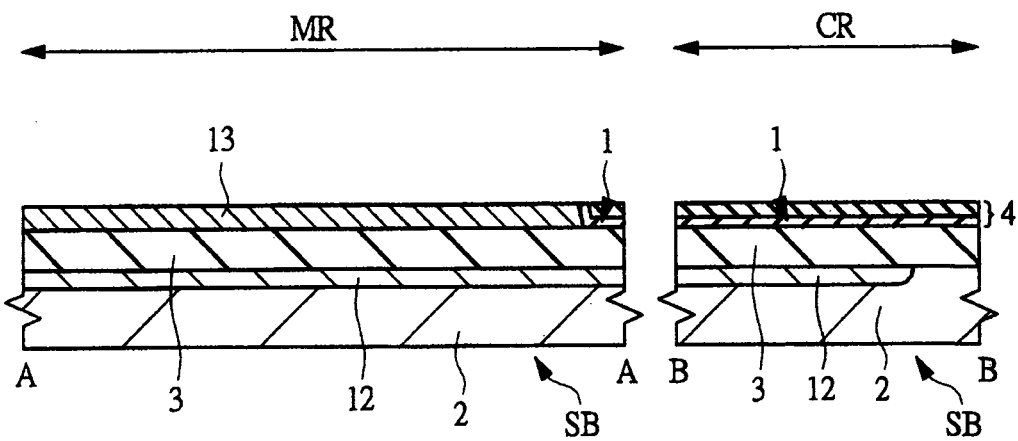
FIG. 8 is a cross-sectional view showing a manufacturing process of the semiconductor device following the process shown in FIG. 7.

Then, as shown in FIG. 8, the $n^+$-type semiconductor region 12 is formed over the upper surface of the support substrate 2 as a diffusion region having a lower resistance than that of the support substrate 2. The formation of the $n^+$-type semiconductor region involves forming a photoresist film over the SOI substrate SB by photolithography, and ion-implanting P (phosphorus) from above the SOI substrate SB to the main surface of the SOI substrate SB using the photoresist film as a mask. At this time, the condition for ion implantation is that P (phosphorus) ions are doped (introduced) in a dose amount of $2\times10^{13}$ cm$^{-2}$ with an energy of 550 keV. Thus, the $n^+$-type semiconductor region 12 is formed over an upper surface of the support substrate 2 under the BOX film 3.

When forming the $n^+$-type semiconductor region 12 doped with P (phosphorus) ions, ion implantation is performed on a condition that suppresses an interface energy level of the $n^+$-type semiconductor region 12 to form Ohmic contact with the contact plug CT2 shown in FIG. 4.

Since ions of P (phosphorus) are implanted into the upper surface of the support substrate 2 (interface with the lower surface of the BOX film 3), the concentration peak of the P (phosphorus) is positioned on the upper surface of the support substrate 2. The amount of P (phosphorus) introduced into the silicon layer 4 over the BOX film 3 is very small as compared to that of P (phosphorus) introduced into the upper surface of the support substrate 2. Thus, P (phosphorus) is hardly introduced into the silicon layer 4.

Thereafter, the p-type well 13 is formed from the upper surface to the lower surface of the silicon layer 4. Specifically, the p-type well 13 is formed by ion-implantation of B (boron) from the SOI substrate SB toward the main surface of the SOI substrate SB using the photoresist film (not shown) used in the formation step of the above $n^+$-type semiconductor region 12 as a mask. The energy of the ion implantation at this time is lower than that of the ion implantation in the formation step of the above $n^+$-type semiconductor region 12. Thus, the p-type well 13 is formed as a channel formation region of the n-channel MOSFETQn in the p-type semiconductor region.

Figure 9:
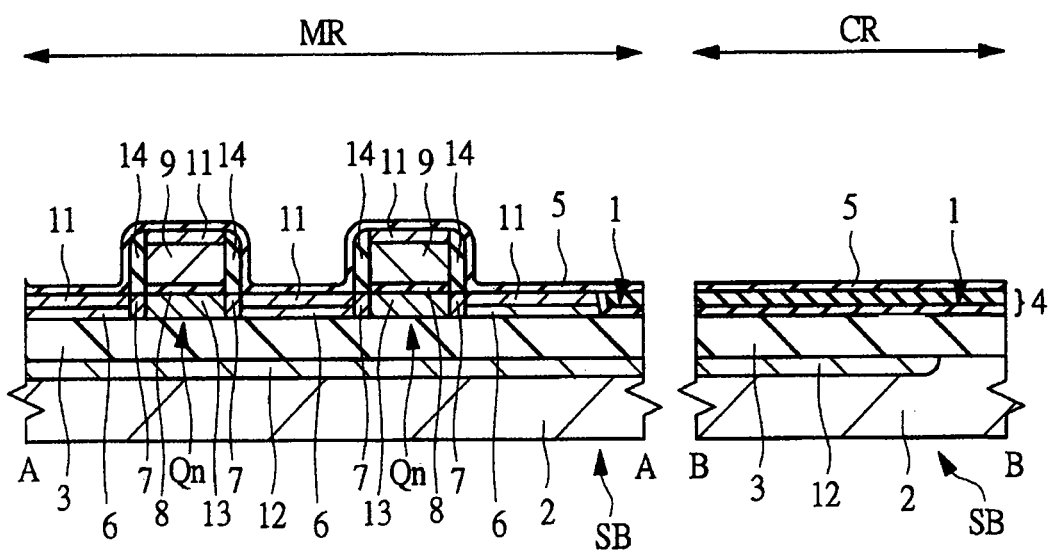
FIG. 9 is a cross-sectional view showing a manufacturing process of the semiconductor device following the process shown in FIG. 8.

Then, illustration of other midway steps will be omitted. As shown in FIG. 9, the n-channel MOSFETQn is formed over the SOI substrate SB by the well-known manufacturing method.

That is, first, the gate insulating film 8 is formed over the surface of the SOI substrate SB (or the surface of the p-type well 13). The gate insulating film 8 can be formed of, for example, a thin silicon oxide film, for example, by the thermal oxidation method.

Then, a silicon film, such as a polycrystalline film, is formed over the SOI substrate SB (that is, over the gate insulating film 8) as a conductive film for formation of the gate electrode. The silicon film formed in the MOSFET formation region MR is an n-type semiconductor film (doped polysilicon film) with a low resistance by ion-implantation of n-type impurities, such as P (phosphorus) or As (arsenic). The silicon film which is an amorphous silicon film at the time of deposition can be converted into the polycrystalline film by the thermal treatment after the deposition (after ion implantation).

Then, by patterning the silicon film using the photolithography method and the dry etching method, the gate electrode 9 comprised of the silicon film is formed in the MOSFET formation region MR to thereby remove the silicon film in the substrate connection region CR.

The gate electrode 9 which is a gate electrode of the n-channel MOSFET is comprised of polycrystalline silicon (n-type semiconductor film, doped polysilicon film) into which the n-type impurities are introduced. The gate electrode 9 is formed over the p-type well 13 via the gate insulating film 8. That is, the gate electrode 9 is formed over the gate insulating film 8 of the p-type well 13.

Then, by ion-implantation of n-type impurities, such as P (phosphorus) or As (arsenic), into the main surface of the SOI substrate SB, (a pair of) extension regions 7 each of which is an $n^-$-type semiconductor region are formed in the silicon layer 4 except for a part under the gate electrode 9 and an area with the element isolation region formed therein. That is, the extension regions 7 are formed on both sides of the gate electrode 9 of the p-type well 13.

Then, a side wall spacer or sidewall (side wall insulating film) 14 comprised of, for example, a silicon oxide film, silicon nitride film, or a laminated film of these insulating films, is formed as an insulating film over each side wall of the gate electrode 9. The sidewall 14 can be formed, for example, by depositing a silicon oxide film or silicon nitride film or a laminated film thereof over the SOI substrate SB, and applying anisotropic etching to the silicon oxide film or silicon nitride film or laminated film thereof by a reactive ion etching (RIE) method or the like.

Then, (a pair of) source/drain regions 6 are formed, for example, by ion-implantation of n-type impurities, such as P (phosphorus) or As (arsenic), into both sides of the gate electrode 9 of the p-type well 13 and the sidewalls 14. After the ion implantation, an annealing process for activating the impurities introduced, for example, a spike anneal process can be performed at a temperature of, for example, 1050° C.

The source/drain region 6 has a higher concentration of impurities than that of the extension region 7. Thus, the n-type semiconductor region (impurity diffusion layer) serving as a source or drain of the n-channel MOSFET is formed of the source/drain region (impurity diffusion layer) 6 and the extension region 7. The extension regions 7 and the source/drain regions 6 serve as the source/drain of the n-channel MOSFETQn. That is, the extension regions 7 and the source/drain regions 6 of the n-channel MOSFETQn form a lightly doped drain (LDD) structure. The extension region 7 is formed in a self-aligned manner with respect to the gate electrode 9, and the source/drain region 6 is formed in a self-aligned manner with respect to the sidewall 14 formed on each side wall of the gate electrode 9.

In this way, the n-channel MOSFETQn is formed as the field-effect transistor in the p-type well 13. The n-channel MOSFETQn can be regarded as an n-channel field-effect transistor.

Then, the silicide layer 11 having a low resistance is formed over the respective surfaces of the gate electrode 9 and the source/drain regions 6 of the n-channel MOSFETQn by a salicide (self aligned silicide) technique.

In order to form the silicide layer 11, first, a metal film is formed (deposited) over the entire (all) surface of the SOI substrate SB including the upper surfaces of the gate electrode 9 and the source/drain regions 6, for example, by sputtering. That is, the metal film is formed over the SOI substrate SB including the gate electrode 9 and the source/drain regions 6 so as to cover the gate electrode 9. The metal film is a metal film containing, for example, Co (cobalt).

After forming the metal film in this way, the thermal treatment is applied twice to the SOI substrate SB, so that the metal film reacts with Si (silicon) contained in the gate electrode 9 and the source/drain region 6. As a result, the silicide layer 11 is formed over the respective upper surfaces of the gate electrode 9 and the source/drain region 6.

That is, the thermal treatment for forming the silicide layer 11 is performed twice. Specifically, a first thermal treatment (first annealing process) is performed at a temperature of 250 to 300° C. to thereby remove an unreacted metal film, and then a second thermal treatment is performed at a temperature of 500 to 600° C. The unreacted metal film is removed by wet cleaning using sulfuric acid, or wet cleaning using sulfuric acid hydrogen peroxide mixture (SPM: a mixture of sulfuric acid and hydrogen peroxide). Thus, the silicide layer 11 is comprised of $CoSi_2$ (cobalt silicide) which is a compound of Co (cobalt) contained in the metal film and Si (silicon) contained in the gate electrode 9, a gate electrode wiring 9a (not shown), and the source/drain region 6. The silicide layer 11 is formed over the respective upper surfaces of the gate electrode 9 and the source/drain regions 6. The material for the silicide layer 11 is not limited to cobalt silicide. The silicide layer 11 may be formed of titanium silicide, nickel silicide, platinum silicide, or the like.

Then, the insulating film 5 is formed so as to cover the main surface (all surface) of the SOI substrate SB including the gate electrodes 9, the source/drain regions 6, the sidewalls 14, and the silicide layer 11. At this time, in the substrate connection region CR, the insulating film 5 is also formed over the element isolation region 1. The insulating film 5 can be formed of, for example, a silicon nitride film by a plasma CVD method at a temperature of deposition (substrate temperature) of about 450° C. The insulating film 5 serves as an etching stopper film in forming a contact hole in the n-channel MOSFETQn. As mentioned above, the structure shown in FIG. 9 can be obtained.

Figure 10:
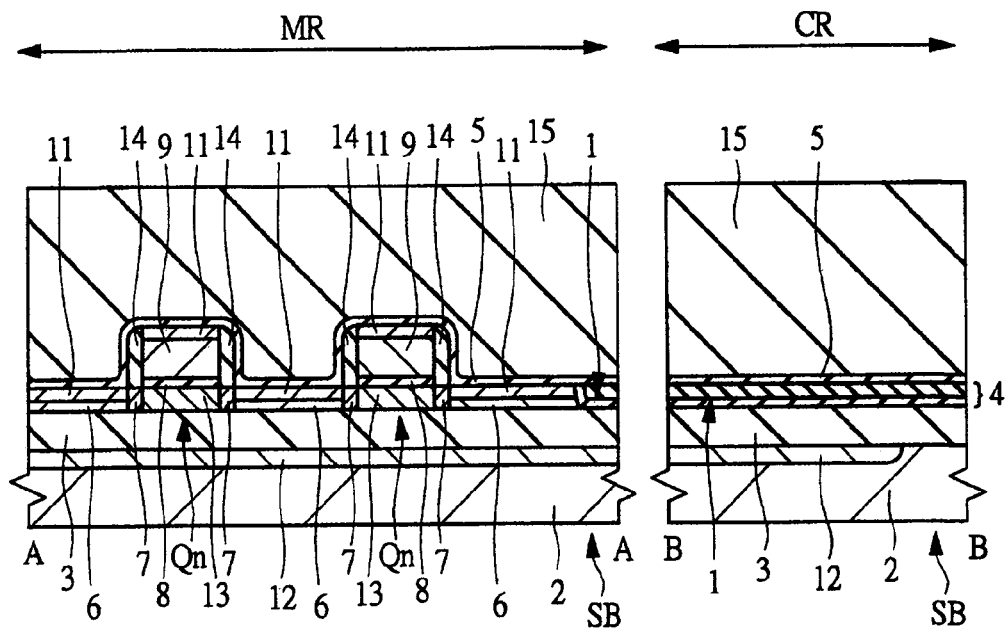
FIG. 10 is a cross-sectional view showing a manufacturing process of the semiconductor device following the process shown in FIG. 9.

Then, as shown in FIG. 10, an interlayer insulating film 15 which is thicker than the insulating film 5 is formed over the insulating film 5. The interlayer insulating film 15 is formed of, for example, a silicon oxide film, and can be formed using TEOS at a deposition temperature of about 450° C. by the plasma CVD method or the like. Thereafter, the surface of the interlayer insulating film 15 is polished by the CMP method to flatten the upper surface of the interlayer insulating film 15. Even when the surface of the interlayer insulating film 15 has asperities due to bumps on the substrate, the surface of the interlayer insulating film 15 is polished by the CMP method, which can provide the interlayer insulating film with a flattened surface.

Figure 11:
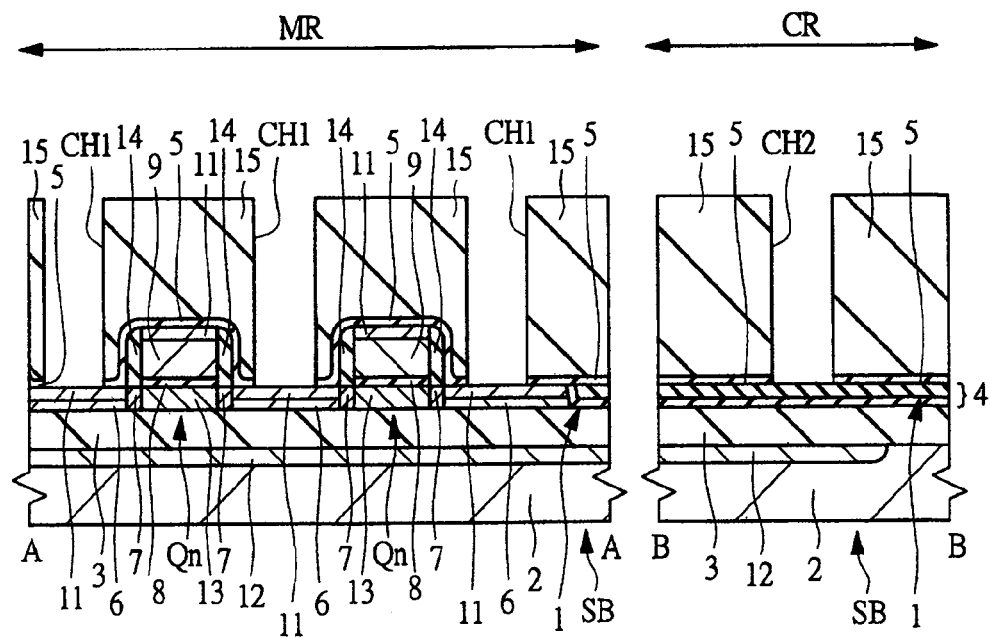
FIG. 11 is a cross-sectional view showing a manufacturing process of the semiconductor device following the process shown in FIG. 10.

Then, as shown in FIG. 11, the insulating film 5 and the interlayer insulating film 15 are subjected to dry etching using a photoresist pattern (not shown) formed over the interlayer insulating film 15 as an etching mask, whereby contact holes CH1 and CH2 (through holes, or openings) are formed in the insulating film 5 and the interlayer insulating film 15. At this time, first, the interlayer insulating film 15 is dry-etched on a condition where the interlayer insulating film 15 is etched more easily than the insulating film 5, using the insulating film 5 as an etching stopper film, whereby the contact holes CH1 and CH2 are formed in the interlayer insulating film 15 to expose the upper surface of the insulating film 5. Thereafter, the insulating film 5 is dry-etched on another condition where the insulating film 5 is etched more easily than the interlayer insulating film 15, whereby parts of the insulating film 5 located at the bottoms of the contact holes CH1 and CH2 are removed. At the bottom of the contact hole CH1, a part of the main surface of the SOI substrate SB, for example, the upper surface of the silicide layer 11 on the surface of the source/drain region 6 is exposed. In a region not shown, the upper surface of the silicide layer 11 above the connection portion 9b (see FIG. 3) located in the same layer as the gate electrode 9 is exposed. At the bottom of the contact hole CH2 in the substrate connection region CR, the upper surface of the element isolation region 1 is exposed.

Figure 12:
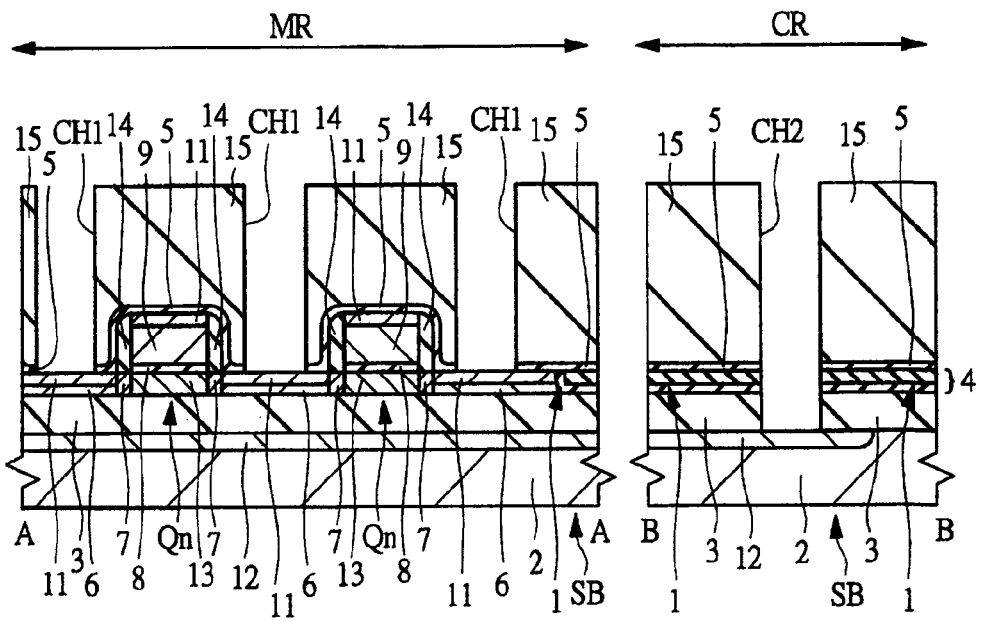
FIG. 12 is a cross-sectional view showing a manufacturing process of the semiconductor device following the process shown in FIG. 11.

Then, as shown in FIG. 12, the element isolation region 1 is dry-etched on a condition where the element isolation region 1 is etched more easily than the silicide layer 11, and then the BOX film 3 is dry-etched on another condition where the BOX film 3 is etched more easily than the silicide layer 11, whereby the upper surface of the $n^+$-type semiconductor region 12 formed over the support substrate 2 is exposed through the contact hole CH2 extending toward the lower surface of the SOI substrate SB. At this time, both of the element isolation region 1 and the BOX film 3 are comprised of $SiO_2$ (silicon oxide). When the element isolation region 1 and the BOX film 3 are intended to be subsequently etched, an opening can be formed from the upper surface of the element isolation region 1 up to the lower surface of the BOX film 3 by one-time etching without changing etching conditions.

After partly removing the insulating film 5 as shown in FIG. 11, parts of the element isolation region 1 and the BOX film 3 are removed by an etching step to expose the upper surface of the n$^+$-type semiconductor region 12 as shown in FIG. 12. In the etching step, the silicide layer 11 in the MOSFET formation region MR serves as an etching stopper film to prevent the damage on the source/drain region 6 and the gate electrode 9 due to the dry etching. As mentioned above, in this embodiment, the contact holes CH1 and CH2 are formed in the same etching step. At this time, the contact hole CH3 (not shown) is also simultaneously formed. Thus, only one mask is needed for formation of the contact holes, which can simplify the manufacturing process.

When forming the contact hole CH2 in the BOX film 3, the silicide layer 11 is subjected to the dry etching, but the damage on the silicide layer 11 by the etching is supposed to be of no matter. This is based on the following reason. The depth of the contact hole CH2 penetrating from the upper surface of the interlayer insulating film 15 to the lower surface of the BOX film 3 is about 1.2 µm, and the depth of the contact hole CH1 (thickness of the interlayer insulating film 15) is about 750 nm. A difference in depth between the contact holes CH1 and CH2 is not relatively large, so that the damage on the silicide layer 11 due to the dry etching is within the acceptable range.

Figure 13:
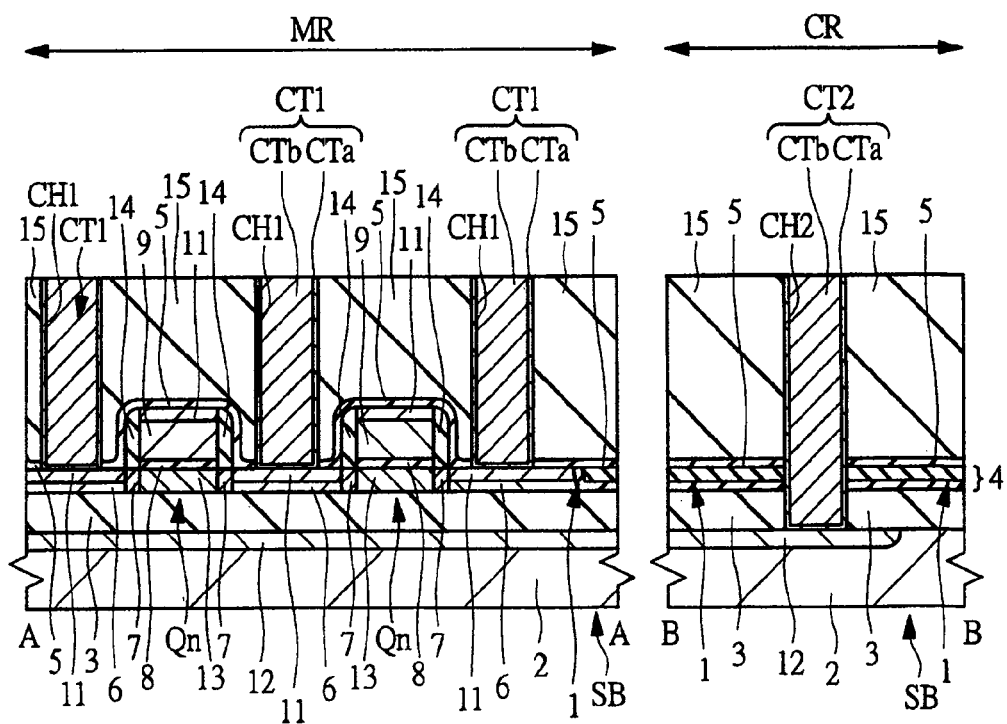
FIG. 13 is a cross-sectional view showing a manufacturing process of the semiconductor device following the process shown in FIG. 12.

Then, as shown in FIG. 13, contact plugs (conductor for connection, buried plug, or buried conductor) CT1 and CT2 are formed of W (tungsten) or the like in the contact holes CH1 and CH2, respectively. In the MOSFET formation region MR, the contact plug CT1 is formed in the contact hole CH1 over the source/drain region 6, whereas in the substrate connection region CR, the contact plug CT2 is formed in the contact hole CH2 over the support substrate 2. The contact plug CT1 is electrically coupled to the source/drain region 6 via the silicide layer 11, and the contact plug CT2 is electrically coupled to the upper surface of the n$^+$-type semiconductor region 12 formed over the upper surface of the support substrate 2.

When respectively forming the contact plugs CT1 and CT2, for example, a barrier conductive film CTa (for example, titanium film, titanium nitride film, or laminated film thereof) is formed over the interlayer insulating film 15 containing the insides (bottom and side walls) of the contact holes CH1 and CH2 by the plasma CVD method at a deposition temperature (substrate temperature) of about 450° C. Then, a main conductive film CTb comprised of a tungsten film or the like is formed over the barrier conductive film CTa by the CVD method or the like to embed the contact holes CH1 and CH2. Unnecessary parts of the main conductive film CTb and the barrier conductive film CTa over the interlayer insulating film 15 are removed by the CMP method or etching back method, so that each of the contact plugs CT1 and CT2 can be formed of the main conductive film CTb and the barrier conductive film CTa. As not shown in the figure, at this time, the silicide layer 11 is formed over the upper surface of the connection portion 9b formed in the same layer as the gate electrode 9. The contact plug CT3 is formed over the connection portion 9b via the silicide layer 11.

Figure 14:
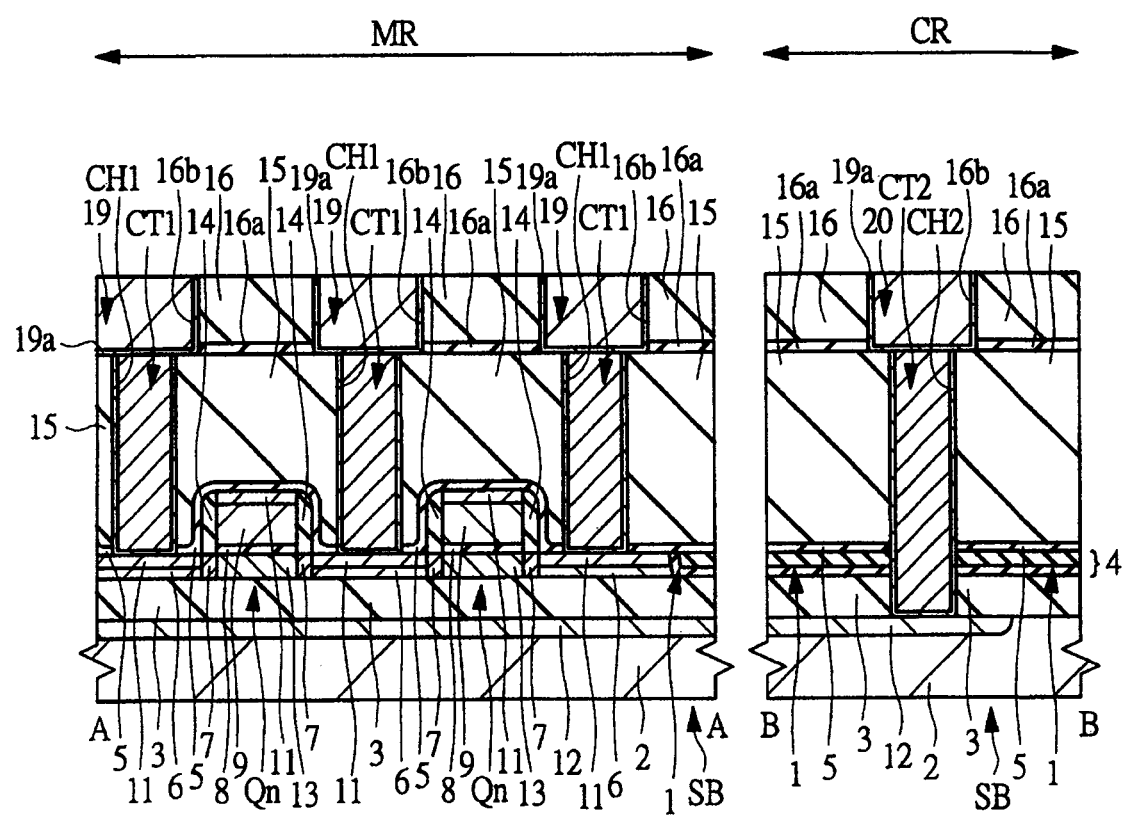
FIG. 14 is a cross-sectional view showing a manufacturing process of the semiconductor device following the process shown in FIG. 13.

Then, as shown in FIG. 14, a stopper insulating film 16a, and an interlayer insulating film 16 for wiring formation are sequentially formed over the interlayer insulating film 15 with the contact plugs CT1, CT2, and CT3 (not shown) embedded therein. The stopper insulating film 16a serves as an etching stopper film in processing the trench in the interlayer insulating film 16. The stopper insulting film 16a is made using material having etching selectivity with respect to the interlayer insulating film 16. The stopper insulating film 16a can be a silicon nitride film formed, for example, by the plasma CVD method. The interlayer insulating film 16 can be a silicon oxide film formed, for example, by the plasma CVD method. The following first layered wiring is formed in the stopper insulating film 16a and the interlayer insulating film 16.

Then, a first layer wiring is formed by a single damascene method. First, wiring trenches 16b are formed in predetermined areas of the interlayer insulating film 16 and the stopper insulating film 16a by dry etching using a resist pattern (not shown) as a mask. Then, a barrier conductive film (barrier metal film) 19a is formed over the main surface of the SOI substrate SB (over the interlayer insulating film 16 including the bottom and side walls of the wiring trenches). The barrier conductive film 19a can be formed of, for example, a titanium nitride film, a tantalum film, or a tantalum nitride film. Subsequently, a copper seed layer is formed over the barrier conductive film 19a by the CVD method or sputtering method, and further a copper plating film is formed over the seed layer using electrolytic plating or the like. The inside of the wiring trench 16b is filled with the copper plating film. Then, the copper plating film, the seed layer, and the barrier conductive film 19a located in regions other than the wiring trench 16b are removed by the CMP method to form first layer wirings 19 and 20 including copper as a principal conductive material.

The wiring 19 is electrically coupled to the source/drain region 6 of the n-channel MOSFETQn via the contact plug CT1. The contact plug CT2 is coupled to the support substrate 2 through the insulating film 5 and the element isolation region 1. The contact plug CT2 is insulated from the source/drain region 6 via the insulating film 15, the element isolation region 1, the BOX film 3, and the like, and thus is not electrically coupled to the source/drain region 6. Thereafter, second layer wirings are formed over the wirings 19 and 20 by the dual damascene method. The illustration of these wirings and a description thereof will be described below. In this way, the manufacture of the semiconductor device in this embodiment is completed.

The wirings 19 and 20 are not limited to a damascene structure, but may have a wiring structure formed by patterning a conductive film including aluminum as a principal component.

As mentioned above, in this embodiment, the n$^+$-type semiconductor region 12 is electrically coupled to the wiring 20 by the contact plug CT2 passing through the contact hole CH2 formed in the element isolation region 1 shown in FIG. 3, which can control the potential of the support substrate 2 of the SOI substrate SB shown in FIG. 4. This arrangement can reduce the parasitic capacitance generated in the n-channel MOSFETQn to prevent the generation of the distortion component (noise).

The drain breakdown voltage of the n-channel MOSFETQn can be improved by controlling (fixing) the potential of the support substrate 2 under the gate electrode 9 as compared to the case where the potential of the support substrate 2 is set to the ground potential. The improvement of the drain breakdown voltage can make the gap between the gate and the drain narrower, and can reduce the size of the gate electrode 9, thus making the entire size of the n-channel MOSFETQn smaller. Reduction in size of the n-channel MOSFETQn can decrease the on resistance of the n-channel MOSFET.

In this embodiment, as mentioned above using FIGS. 11 and 12, the contact holes CH1 and CH2 are formed in the same etching process, which can simplify the manufacturing processes of the semiconductor device. Thus, the contact holes CH1 and CH2 can be formed in a minimum number of steps. At this time, the use of the silicide layer 11 and the insulating film 5 as an etching stopper film can prevent the gate electrode 9 and the source/drain region 6 from being etched, and thus prevent the reduction of the reliability of the semiconductor device.

As mentioned above, in the semiconductor device of this embodiment, the use of the SOI substrate SB for manufacturing the semiconductor device enables improvement of the performance of the semiconductor device in addition to reduction in cost of products using the semiconductor device, as compared to the case of manufacturing a semiconductor device using a GaAs substrate or an SOS substrate.

In this embodiment, the structure of the switch SW1 has been described by way of example as shown in FIG. 2. Other switches SW2, SW3, and SW4 shown in FIG. 1 have the same structure as that of the switch SW1, and can control the potential of the support substrate 2 by the contact plugs CT2 formed in the respective switches.

The n-channel MOSFETsQn are arranged between the contact plugs CT2 arranged in the first direction, and the region where the contact plug CT2 is formed is as small as possible, which can suppress an increase in area of the semiconductor chip.

Although in this embodiment, the n-channel MOSFET has been described by way of example, the invention can be applied to the p-channel MOSFET. When the potential of the support substrate under the p-channel MOSFET is controlled, a diffusion layer (corresponding to the n$^+$-type semiconductor region 12 shown in FIG. 4) formed over the upper surface of the support substrate is a p-type semiconductor region. In this case, in order to form the p-type semiconductor region in the step described with reference to FIG. 8, ion implantation is performed on the support substrate using not the element P (phosphorus), but the element B (boron) with an energy of 200 keV in a dose amount of $2\times10^{13}$ cm$^{-2}$. Thus, the p-type semiconductor region having a low resistance is formed over the upper surface of the support substrate. Referring to FIG. 4, the well under the gate electrode 9 is an n-type semiconductor region, and each of the extension region 7 and the source/drain region 6 is a p-type semiconductor region.

That is, the semiconductor device of this embodiment includes the n-channel MOSFET and the p-type MOSFET. In the region where the n-channel MOSFET is formed, the diffusion layer formed over the upper surface of the support substrate is the n$^+$-type semiconductor region 12. In the region where the p-channel MOSFET is formed, the diffusion layer formed over the upper surface of the support substrate 2 is the p$^+$-type semiconductor region. This effect made by this arrangement will be as follows. When the diffusion layer formed over the upper surface of the support substrate 2 is regarded as a gate electrode via the silicon layer 4 and the BOX film 3, the diffusion layer is set to the same conduction type as that of the surface gate electrode 9. As a result, a difference in work function between the front side and the back side with respect to the silicon layer 4 can become smaller to improve the controllability of the potential. This arrangement is very effective when the gate electrode 9 is set to the same potential as the diffusion layer (n$^+$-type semiconductor region 12, and p$^+$-type semiconductor region), like this embodiment.

Second Embodiment

Figure 15:
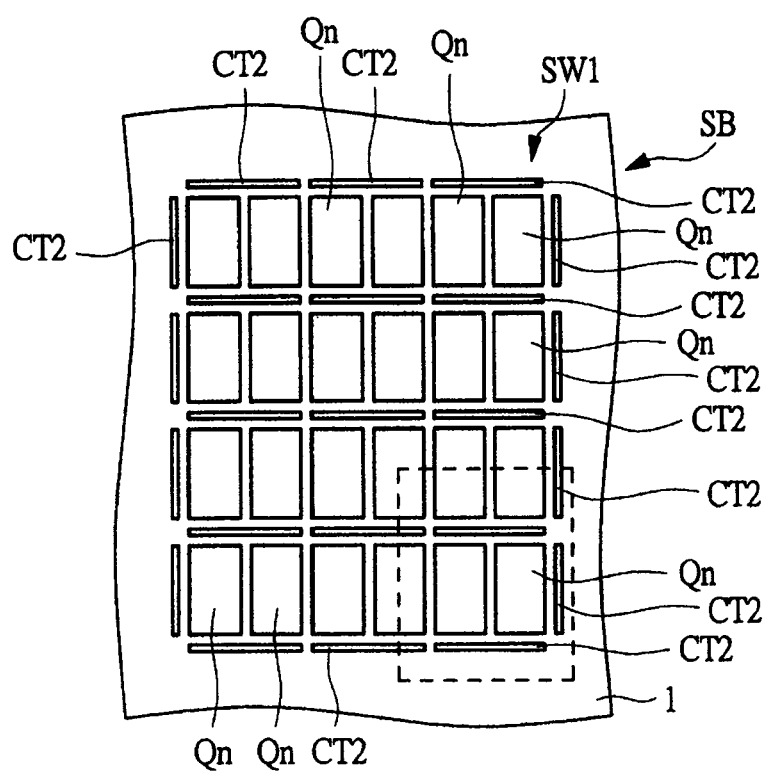
FIG. 15 is a plan view of a semiconductor device according to a second embodiment of the invention.
Figure 16:
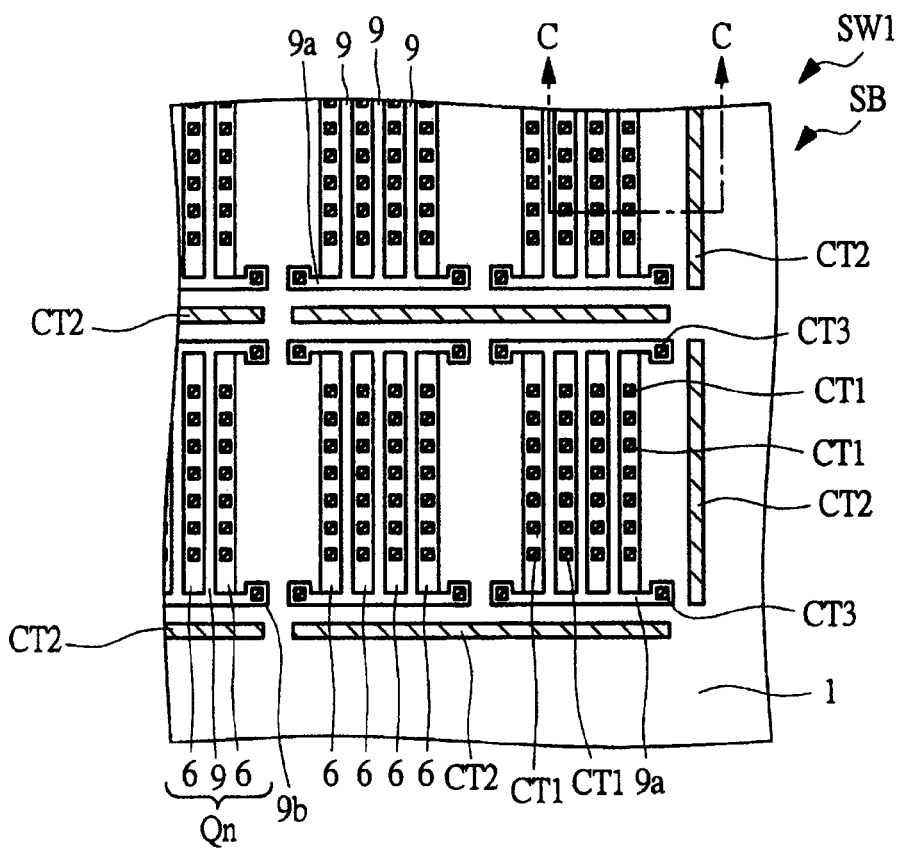
FIG. 16 is an enlarged plan view of a part shown in FIG. 15.

The first embodiment has described the technique for controlling the potential of the support substrate 2 shown in FIG. 4. The technique involves forming the contact plugs CT2 only near the gate electrodes 9 formed side by side in the first direction and the ends of the source/drain regions 6 at the plane of the SOI substrate SB as shown in FIG. 2. This embodiment will describe another semiconductor device using FIGS. 15 and 16. The semiconductor device includes contact plugs CT2 additionally formed on the outside of the outermost source/drain regions 6 in the second direction of the source/drain regions 6 formed in the second direction, in addition to the contact plugs CT2 described in the first embodiment. FIG. 15 is a plan view of the switch SW1 of the semiconductor device in this embodiment. FIG. 16 is an enlarged plan view of an area enclosed by a broken line of FIG. 15.

The switch SW1 shown in FIG. 15 is one shown by enlarging the switch SW1 shown in FIG. 1. The semiconductor device of this embodiment has the substantially same structure as that described in the first embodiment. As shown in FIG. 15, this embodiment differs from the first embodiment in that the contact plugs CT2 are also formed in the element isolation region 1 outside of the MOSFETS located at the end of the matrix in the second direction at the switch SW1 or other switches SW2, SW3, and SW4 (not shown).

That is, the semiconductor device of this embodiment includes the n-channel MOSFETsQn formed in the matrix within the switch SW1, and the element isolation region 1 formed over the main surface of the SOI substrate SB so as to enclose the n-channel MOSFETsQn. Further, the semiconductor device of this embodiment includes the contact plugs CT2 formed between the n-channel MOSFETsQn adjacent to each other in the first direction, and the contact plugs CT2 discontinuously formed so as to surround the switch SW1. The contact plugs CT2 are formed to be surrounded by the element isolation region 1 at the plane of the SOI substrate SB.

As shown in the plan view of FIG. 16, the contact plugs CT2 formed outside the ends in the second direction of the n-channel MOSFETsQn formed side by side in the second direction extend in the first direction like the n-channel MOSFETsQn, and are formed not continuously but discontinuously along one side of the switch SW1. The reason why the contact plug CT2 is formed not continuously but discontinuously in the second direction or the first direction is that the resist fall and generation of stress in the contact plug CT2 are prevented as mentioned above.

All contact plugs CT2 are formed to be surrounded by the element isolation region 1 at the plane of the SOI substrate SB, and are insulated from the n-channel MOSFETsQn including the source/drain regions 6.

As mentioned above, in this embodiment, as shown in FIGS. 15 and 16, the contact plugs CT2 are formed to extend in the first direction at the end of the switch SW1. Thus, the potential of the support substrate 2 can be easily controlled in a position closer to the n-channel MOSFETQn as compared to the semiconductor device of the first embodiment, which can effectively prevent the generation of distortion.

The substrate potential of the support substrate 2 is easily controllable to improve the drain breakdown voltage of the n-channel MOSFETQn, which can reduce the on resistance, and can make the size of the semiconductor device smaller, thus improving the performance of the semiconductor device.

Third Embodiment

This embodiment differs from the first embodiment in that the insulating film 5 is opened before forming the contact hole CH2 with the contact plug CT2 formed therein. Points of manufacturing processes of the semiconductor device of this embodiment different from those of the first embodiment will be described using FIG. 17 to FIG. 20. FIGS. 17 to 20 are cross-sectional views in the same position as the cross-sectional view taken along the line C-C of FIG. 16.

When manufacturing the semiconductor device of this embodiment, first, the n-channel MOSFETQn is formed over the SOI substrate SB shown in FIG. 9, and the insulating film 5 is formed to cover the upper surfaces of the n-channel MOSFETQn and the SOI substrate SB in the same process as that of the first embodiment shown in FIG. 9.

Figure 17:
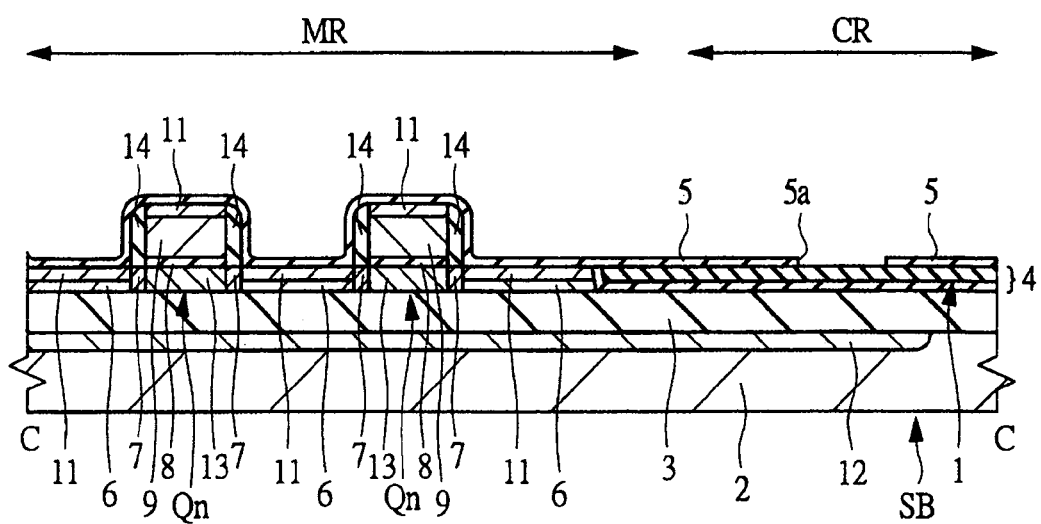
FIG. 17 is a cross-sectional view taken along the line C-C of FIG. 16, while showing a manufacturing process of the semiconductor device according to a third embodiment of the invention.

Then, as shown in FIG. 17, a part of the insulating film 5 is removed in the substrate connection region CR by the photolithography method and dry etching method to form an opening 5a, so that the upper surface of the element isolation region 1 formed in the silicon layer 4 is exposed. At this time, the opening 5a of the insulating film 5 has a diameter (width) wider along the main surface of the SOI substrate SB than that of the contact hole CH2 formed in the following step. This is because a positional misalignment in formation of the contact hole CH2 by the dry etching is taken into consideration to ensure a margin for positional alignment.

Figure 18:
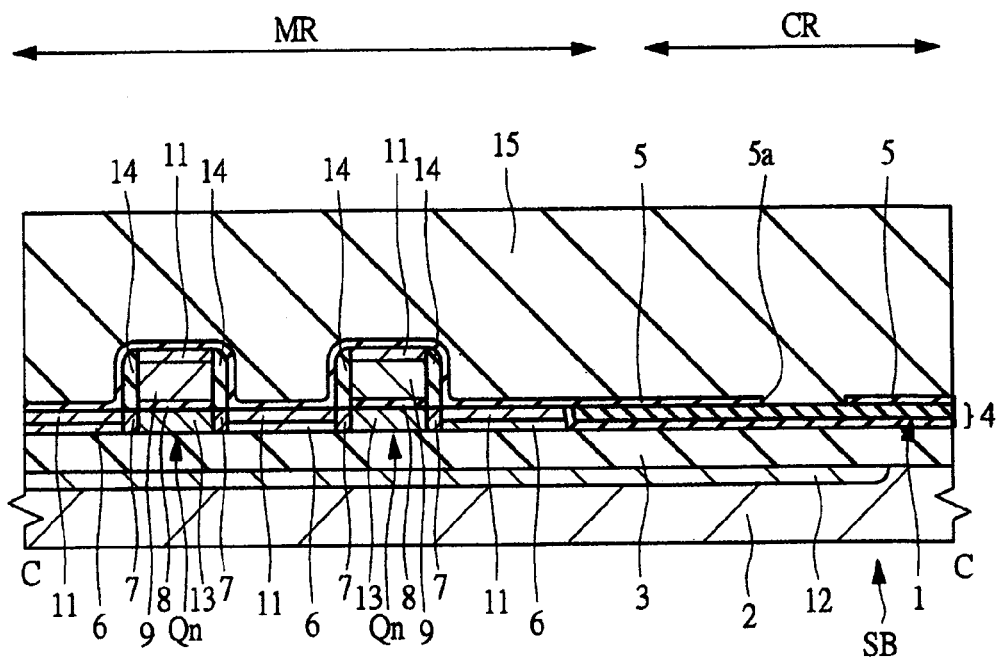
FIG. 18 is a cross-sectional view showing a manufacturing process of the semiconductor device following the process shown in FIG. 17.

Then, as shown in FIG. 18, the interlayer insulating film 15 is formed (deposited) of $SiO_2$ (silicon oxide) over the SOI substrate SB by the CVD method or the like.

Figure 19:
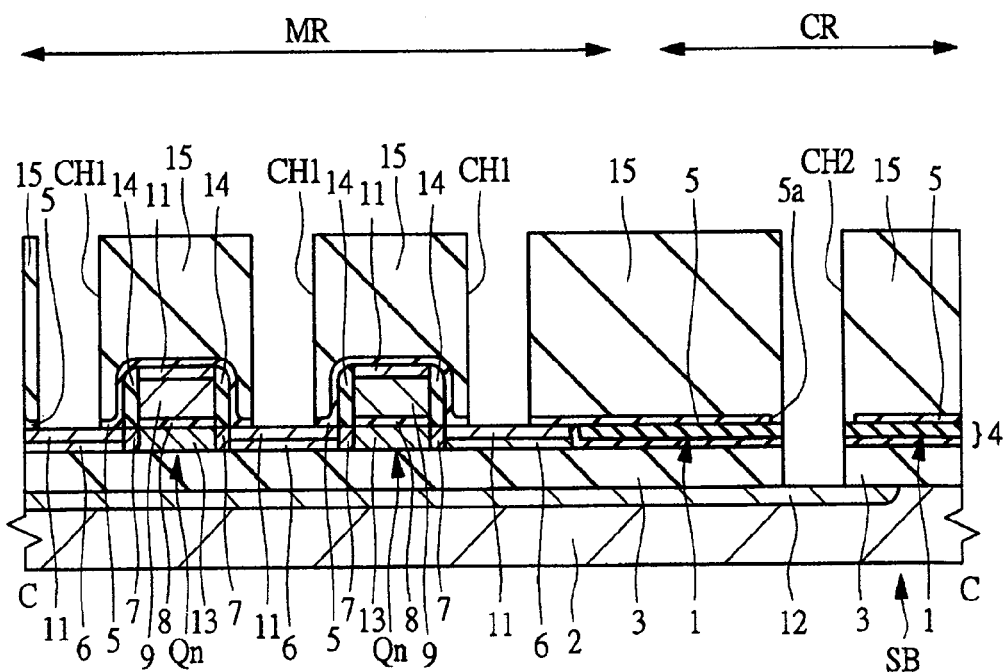
FIG. 19 is a cross-sectional view showing a manufacturing process of the semiconductor device following the process shown in FIG. 18.

As shown in FIG. 19, the contact holes CH1 and CH2 are respectively formed by the photolithography and dry etching. At this time, the interlayer insulating film 15, the element isolation region 1, and the BOX film 3 are comprised of $SiO_2$ (silicon oxide) having an etching selectivity with respect to the insulating film 5. By one-time etching step, the contact hole CH1 exposes the upper surface of the insulating film 5 without penetrating the insulating film 5, and the contact hole CH2 exposes the upper surface of the support substrate 2 (upper surface of the $n^+$-type semiconductor region 12). Thereafter, the insulating film 5 under the contact hole CH1 is removed by the dry etching to expose the upper surface of the silicide layer 11, which provides the structure shown in FIG. 19.

Figure 20:
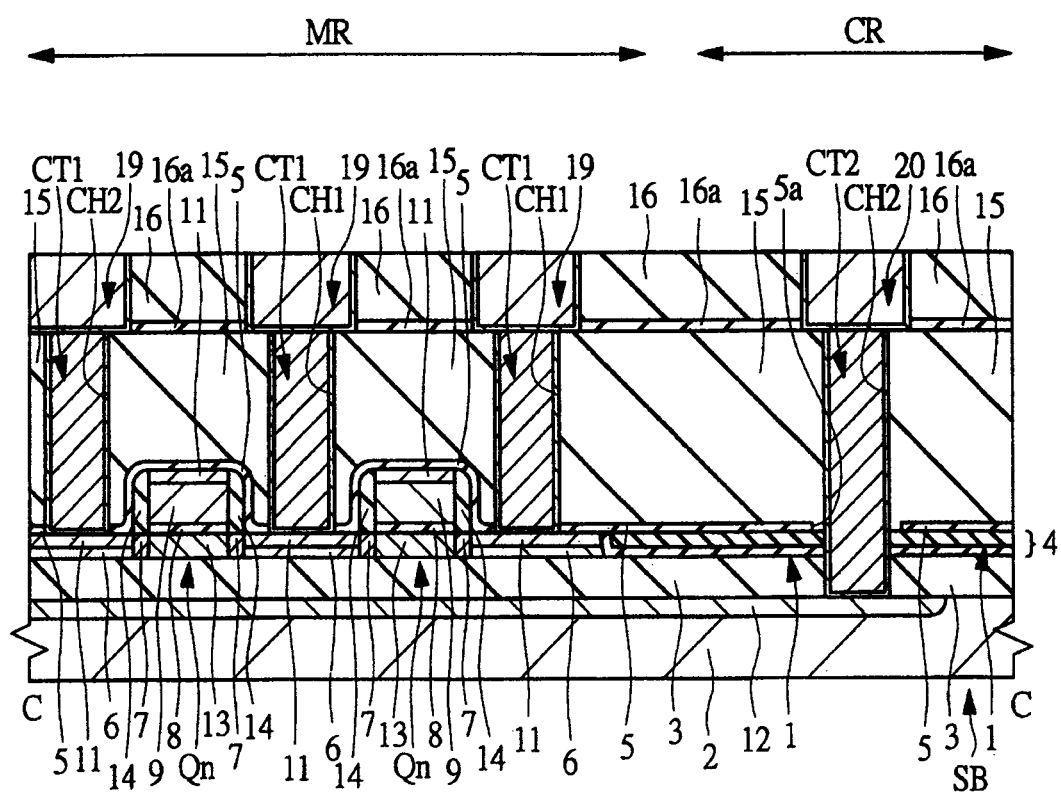
FIG. 20 is a cross-sectional view showing a manufacturing process of the semiconductor device following the process shown in FIG. 19.

Thereafter, in the same processes as those described using FIGS. 13 and 14 in the first embodiment, the contact plugs CT1 and CT2, and the wirings 19 and 20 are formed to complete the manufacture of the semiconductor device shown in FIG. 20. As shown in FIG. 20, unlike the semiconductor device of the first embodiment shown in FIG. 14, in this embodiment, the interlayer insulating film 15 is formed between the insulating film 5 and the contact plug CT2 along the main surface of the SOI substrate SB. The contact plug CT2 is formed to pass through the opening 5a of the insulating film 5 having a diameter (width) wider than that of the contact plug CT2 in the direction along the main surface of the SOI substrate SB. That is, in the substrate connection region CR shown in FIG. 20, the element isolation region 1 is formed in the silicon layer 4 over the upper surface of the SOI substrate SB. The insulating film 5 is formed over the element isolation region 1, and has the opening 5a for exposing a part of the upper surface of the element isolation region 1. The interlayer insulating film 15 is formed over the element isolation region 1 and the insulating film 5. The interlayer insulating film 15, the element isolation region 1, and the BOX film 3 have the contact hole CH2 formed therein. The contact hole CH2 passes through the opening 5a from the upper surface of the interlayer insulating film 15 to the lower surface of the BOX film 3 to expose the upper surface of the support substrate 2. The contact plug CT2 is formed in the contact hole CH2.

As described using FIG. 17, the insulating film 5 is opened before forming the contact hole CH2. Then, the insulating film 5 is not removed in the substrate connection region CR when forming the contact hole CH2 shown in FIG. 19. Thus, in the process from when the upper surface of the interlayer insulating film 15 is started to be etched to when the upper surface of the $n^+$-type semiconductor region 12 is exposed so as to form the contact hole CH2, it is not necessary to change the type of etching material into one having excellent selectivity for removing SiN included in the insulating film 5. The etching process for forming the contact hole CH2 can be simplified. Since the insulating film 5 on the silicide layer 11 is removed after the contact hole CH2 exposes the upper surface of the $n^+$-type semiconductor region 12, the damage on the silicide layer 11 due to the dry etching can be reduced.

The manufacturing method of this embodiment has been described with reference to the cross-sectional view taken along the line C-C of FIG. 16 in the second embodiment, and can be obviously applied to the layout shown in FIG. 3 in the first embodiment.

Fourth Embodiment

Figure 21:
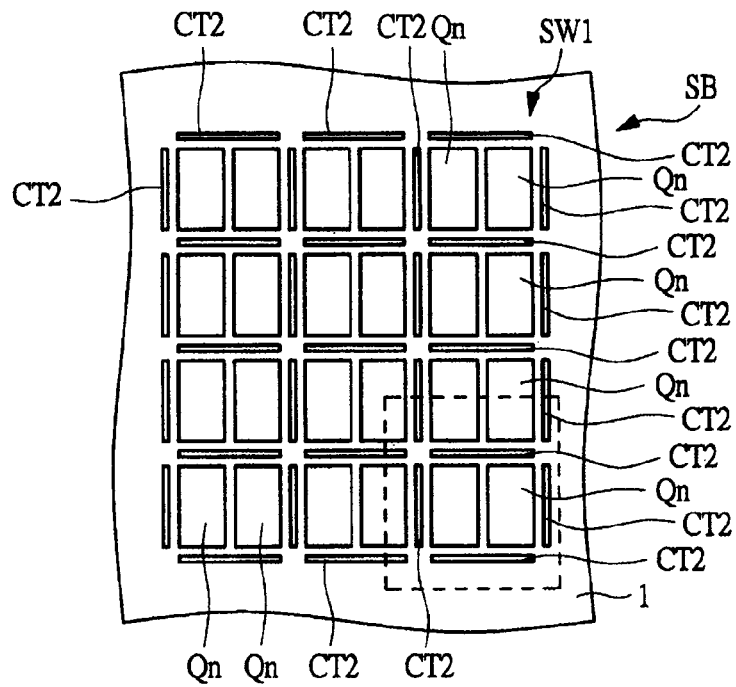
FIG. 21 is a plan view of a semiconductor device according to a fourth embodiment of the invention.
Figure 22:
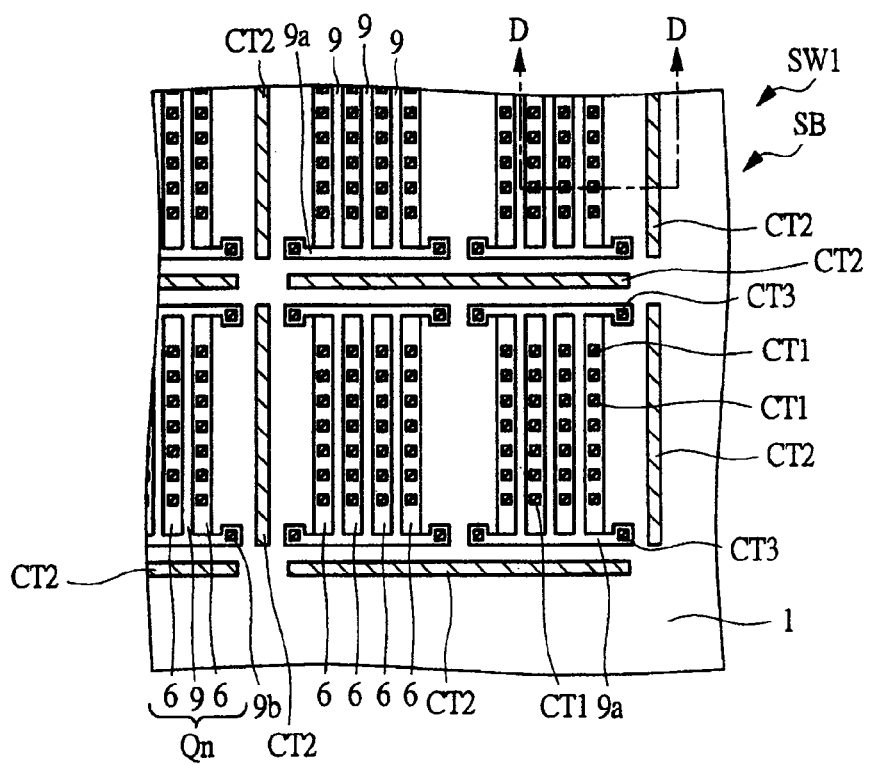
FIG. 22 is an enlarged plan view of a part shown in FIG. 21.

This embodiment will describe a semiconductor device including more contact plugs CT2 than those in the second embodiment with reference to FIGS. 21 and 22.

FIG. 21 is a plan view of a switch SW1 of the semiconductor device in this embodiment. FIG. 22 is an enlarged plan view showing an area enclosed by a broken line of FIG. 21.

The switch SW1 shown in FIG. 21 is one shown by enlarging the switch SW1 shown in FIG. 1. As shown in FIGS. 21 and 22, the semiconductor device of this embodiment has the substantially same structure as that described in the first embodiment. In the switch SW1 or other switches SW2, SW3, and SW4 (not shown), the contact plugs CT2 are formed to pass through the element isolation region 1 between the n-channel MOSFETsQn adjacent to each other in the second direction and to extend in the first direction. That is, in addition to the contact plugs CT2 extending in the second direction and arranged side by side in the first and second directions like the second embodiment, in this embodiment, additional contact plugs CT2 extending in the first direction are formed side by side in the first and second directions along the n-channel MOSFETQn. The n-channel MOSFETQn extending in the first direction is formed between the contact plugs CT2 each extending in the first direction and arranged adjacent to each other in the second direction. That is, the n-channel MOSFETsQn formed in the matrix in the switch SW1 are sandwiched between the contact plugs CT2 in the first and second directions.

That is, in this embodiment, the contact plugs CT2 extending in the first direction are formed not only at an outer periphery of the switch SW1, but also between both groups of MOSFETs, which in each group share the gate electrode 9. The contact plugs CT2 extending in the first direction are arranged at a ratio of one contact plug to two groups of MOSFETs, which in each group share the gate electrode 9.

This embodiment includes more contact plugs CT2 extending in the first direction than those of the semiconductor device described in the second embodiment. Accordingly, this embodiment can control the potential of the support substrate 2 in a position closer to the n-channel MOSFETQn as compared to the semiconductor device of the first and second embodiments, and thus can effectively prevent the generation of distortion.

Figure 25:
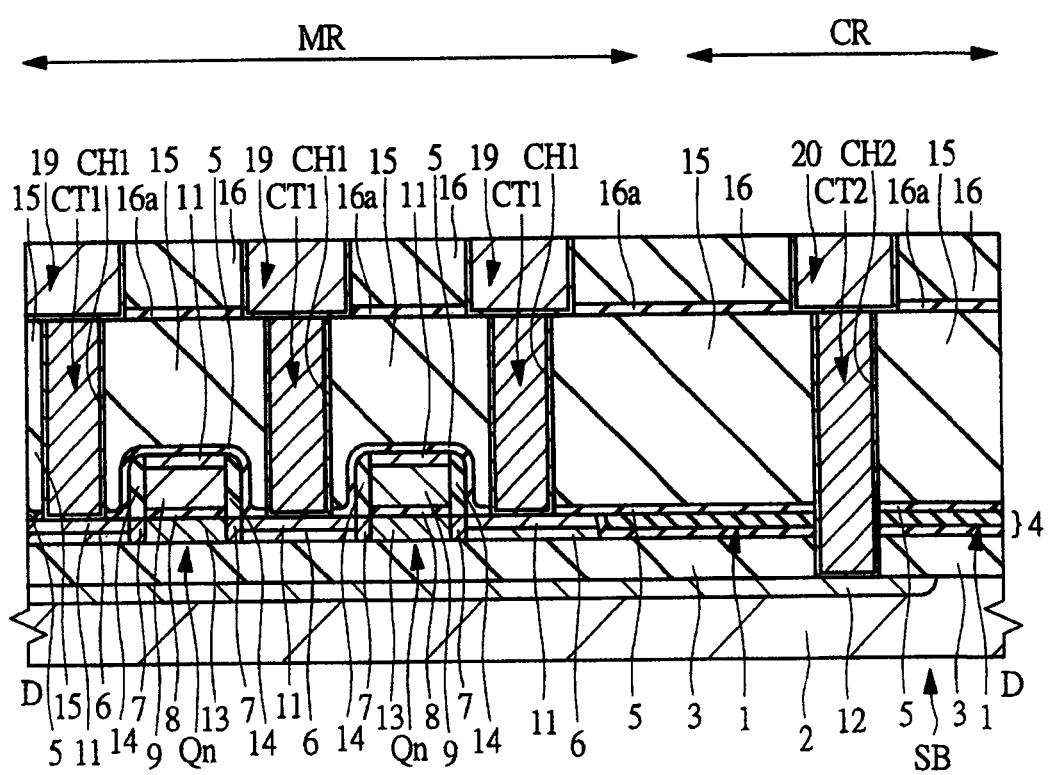
FIG. 25 is a cross-sectional view showing a manufacturing process of the semiconductor device following the process shown in FIG. 24.

All contact plugs CT2 are formed to be surrounded by the element isolation region 1 at the plane of the SOI substrate SB, and are insulated from the source/drain regions 6, the extension region 7, and the p-type well 13 formed in the silicon layer 4 shown in FIG. 25.

The manufacturing method of the semiconductor device described in this embodiment may be applied not only to the manufacturing method of the first embodiment, but also to the manufacturing method of the third embodiment.

Fifth Embodiment

This embodiment differs from the first and third embodiments in that the contact holes CH1 and CH2 are respectively formed in different steps.

Figure 23:
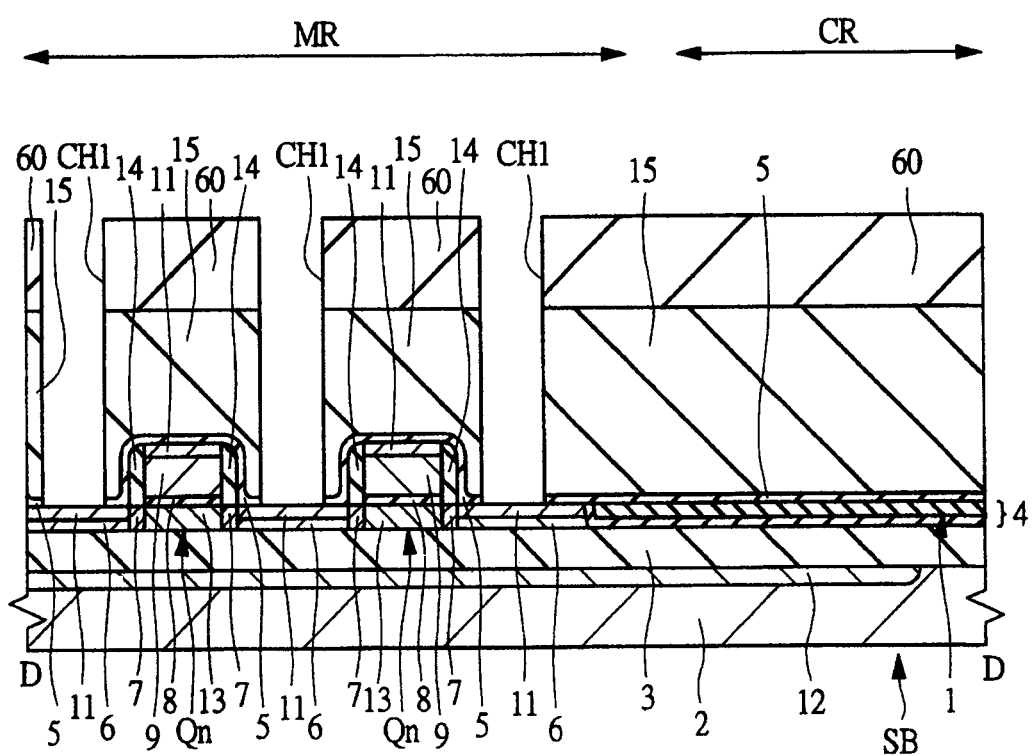
FIG. 23 is a cross-sectional view taken along the line D-D of FIG. 22, while showing a manufacturing process of the semiconductor device according to a fifth embodiment of the invention.
Figure 24:
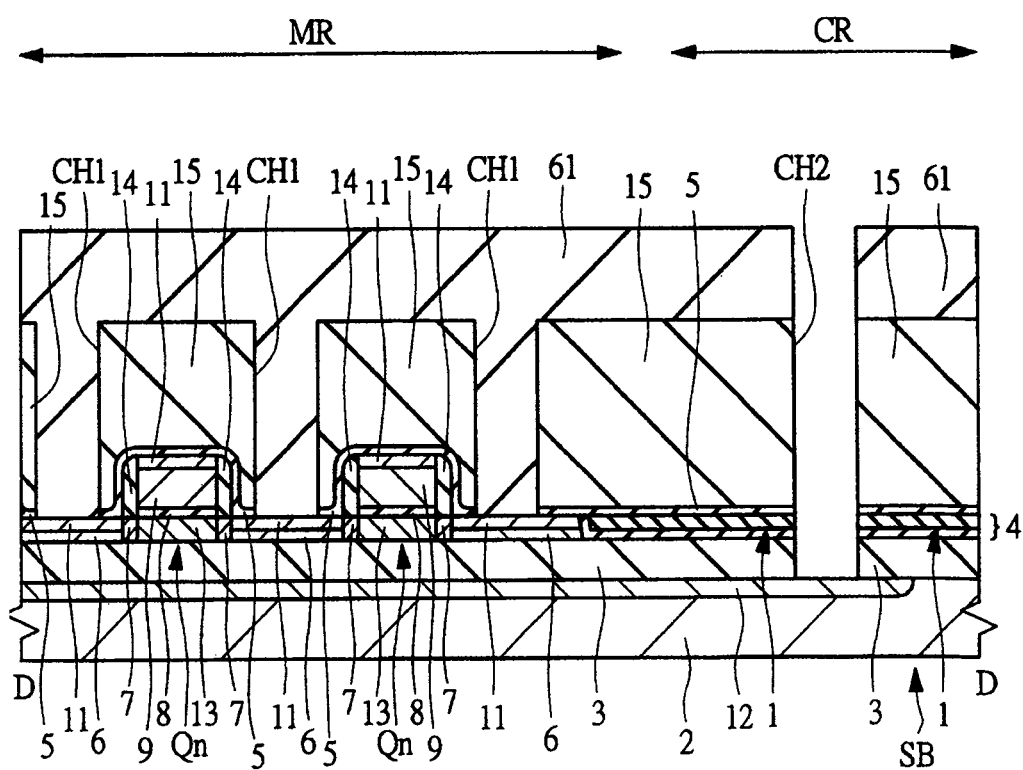
FIG. 24 is a cross-sectional view showing a manufacturing process of the semiconductor device following the process shown in FIG. 23.

Now, a manufacturing method of the semiconductor device according to this embodiment will be described below using FIGS. 23 to 25. FIGS. 23 to 25 show cross-sectional views in the same position as the cross-sectional view taken along the line D-D of FIG. 22.

The n-channel MOSFETQn is formed over the SOI substrate SB shown in FIG. 10, and the insulating film 5 and the interlayer insulating film 15 are sequentially formed over the SOI substrate SB by the same processes described in the first embodiment with reference to FIGS. 5 to 10.

Then, as shown in FIG. 23, a photoresist film 60 patterned is formed over the interlayer insulating film 15 using the photolithography. The photoresist film 60 covers the interlayer insulating film 15 in the substrate connection region CR. The upper surface of the interlayer insulating film 15 directly above the source/drain region 6 of the n-channel MOSFETQn is exposed without being covered with the photoresist film 60.

Thereafter, the dry etching is performed using the photoresist film 60 as a mask to form the contact holes CH1 which penetrate from the upper surface of the interlayer insulating film 15 through the lower surface of the insulating film 5 to expose the upper surface of the silicide layer 11 above the source/drain region 6 and the connection portion 9b (not shown) of the gate electrode 9. As not shown in the figure, at this time, the contact hole 3 is also formed to be coupled to the gate electrode 9.

Then, as shown in FIG. 24, after removing the photoresist film 60, a photoresist film 61 is formed by the photolithography to cover the upper surface of the interlayer insulating film 15 except for a part of the substrate connection region CR, and to fill the contact holes CH1. At this time, a part of the upper surface of the interlayer insulating film 15 in the substrate connection region CR is exposed without being covered with the photoresist film 61.

Thereafter, the contact holes CH2 are formed by the dry etching using the photoresist film 61 as a mask. The contact holes CH2 penetrate from the upper surface of the interlayer insulating film 15 through the lower surface of the BOX film 3 to expose the upper surface of the support substrate 2 (upper surface of the n$^+$-type semiconductor region 12). As a result, the structure shown in FIG. 24 is obtained. Specifically, at this time, the insulating film 5 is not previously opened before forming the contact hole CH2. When the contact hole CH2 is formed by removal using the dry etching method, first, the interlayer insulating film 15 comprised of $SiO_2$ (silicon oxide) is removed to expose the insulating film 5. Then, after one etching condition performed is switched to another etching condition which can easily remove the insulating film 5 comprised of SiN (silicon nitride), another etching process is performed. Further, after the etching condition is switched to a further etching condition which can easily remove the element isolation region 1 comprised of $SiO_2$ (silicon oxide) and the BOX film 3, a further etching process is performed.

Thereafter, the photoresist film 61 is removed. The following steps are performed in the same way as in the first embodiment shown in FIGS. 13 and 14. After forming the contact plugs CT1, CT2, and CT3, the wirings 19 and 20 are formed. Thus, the manufacture of the semiconductor device of this embodiment shown in FIG. 25 is completed.

The manufacturing method of the semiconductor device in this embodiment differs from the first and third embodiments in that the photoresist films 60 and 61 are used to form the contact holes CH1 and CH2 in different steps, respectively, as shown in FIGS. 23 and 24. Since in this embodiment, the contact hole CH1 is covered with the photoresist film 61 upon forming the contact hole CH2, the silicide layer 11 can be prevented from being damaged by the dry etching. Since the upper surface of the n$^+$-type semiconductor region 12 is not etched at the bottom of the contact hole CH2 when exposing the silicide layer 11 at the bottom of the contact hole CH1, the n$^+$-type semiconductor region 12 at the bottom of the contact hole CH2 can be prevented from being damaged.

The manufacturing method of this embodiment has been described with reference to the cross-sectional view taken along the line D-D of FIG. 22 in the fourth embodiment, and can be obviously applied to the layout of the first embodiment shown in FIG. 3, and the layout of the second embodiment shown in FIG. 16.

Sixth Embodiment

Figure 26:
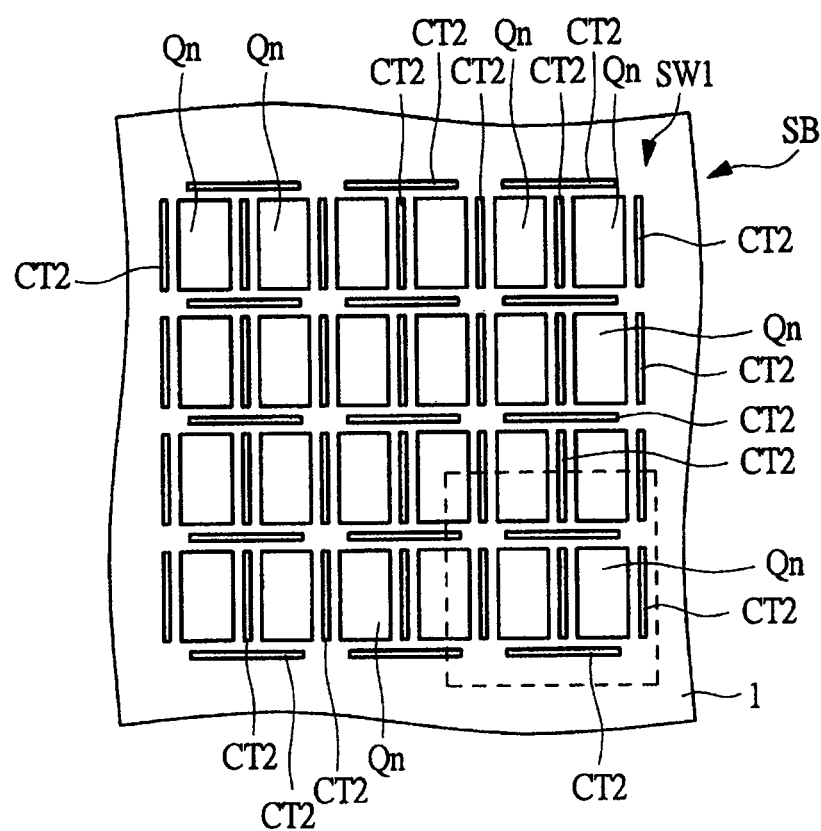
FIG. 26 is a plan view of a semiconductor device according to a sixth embodiment of the invention.
Figure 27:
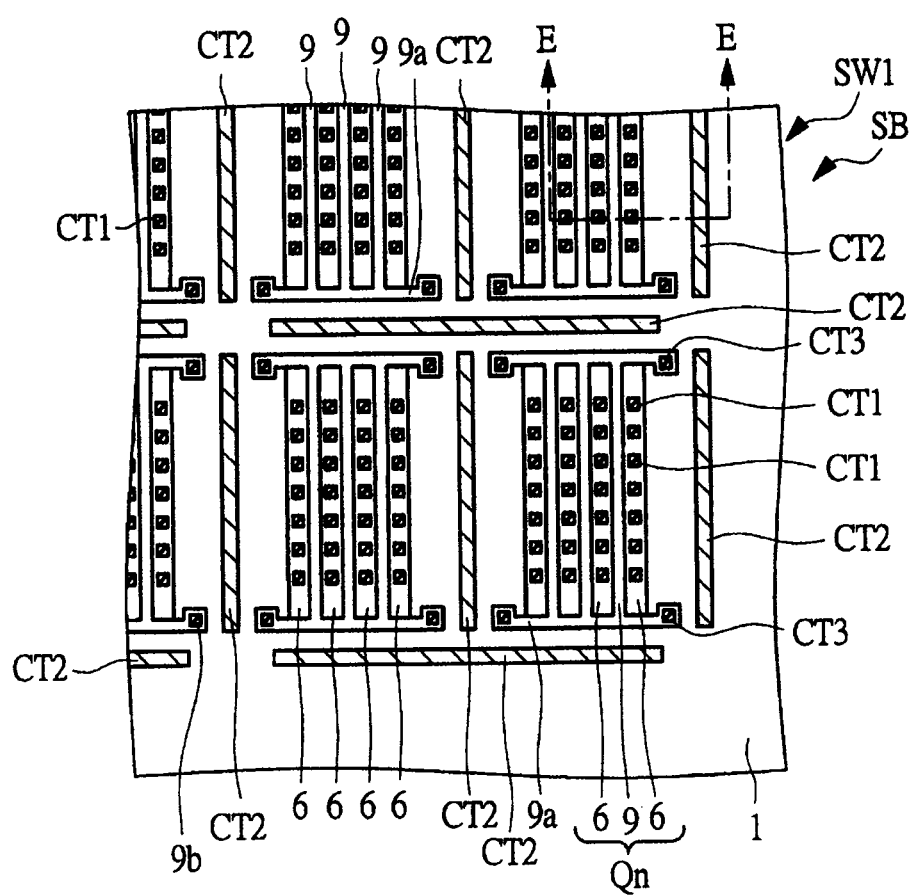
FIG. 27 is an enlarged plan view of a part shown in FIG. 26.

This embodiment will describe a semiconductor device including more contact plugs CT2 than those in the fourth embodiment with reference to FIGS. 26 and 27.

FIG. 26 is a plan view of the switch SW1 of the semiconductor device in this embodiment. FIG. 27 is an enlarged plan view showing an area enclosed by a broken line of FIG. 26.

The switch SW1 shown in FIG. 26 is one shown by enlarging the switch SW1 shown in FIG. 1. As shown in FIGS. 26 and 27, the semiconductor device of this embodiment has the substantially same structure as that of the semiconductor device described in the fourth embodiment. The switch SW1 or other switches SW2, SW3, and SW4 (not shown) includes much more contact plugs CT2 arranged in the second direction, each plug extending in the first direction, than those in the third embodiment. That is, a number of contact plugs CT2 are arranged side by side in the second direction as compared to the third embodiment. The contact plugs CT2 each extending in the first direction are positioned to narrow a gap between the contact plugs CT2 adjacent to each other in the second direction, which thus decreases the number of the n-channel MOSFETsQn between the adjacent contact plugs CT2 in the second direction.

This embodiment includes more contact plugs CT2 extending in the first direction than those of the semiconductor device described in the fourth embodiment. Accordingly, this embodiment can control the potential of the support substrate 2 in a position closer to the n-channel MOSFETQn, and thus can effectively prevent the generation of distortion.

That is, in this embodiment, the contact plugs CT2 extending in the first direction are formed not only at an outer periphery of the switch SW1, but also between the groups of MOSFETs, which in each group share the gate electrode 9. The contact plugs CT2, each extending in the first direction, are arranged at a ratio of one contact plug to one group of MOSFETs, which in each group share the gate electrode 9.

Figure 30:
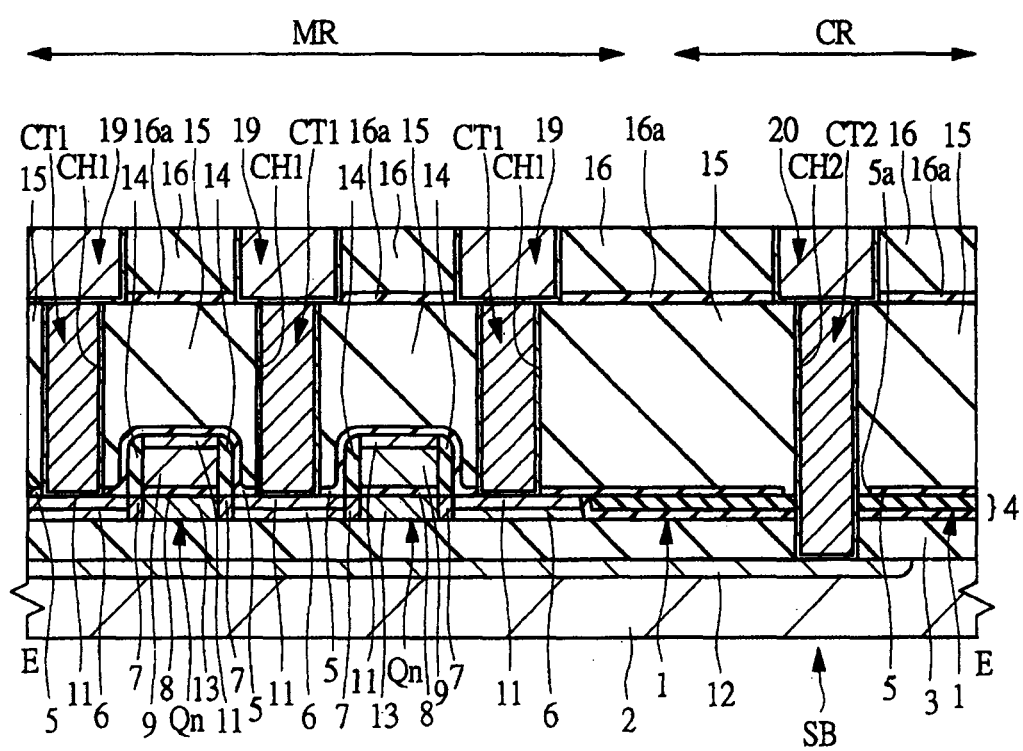
FIG. 30 is a cross-sectional view showing a manufacturing process of the semiconductor device following the process shown in FIG. 29.

All contract plugs CT2 are surrounded by the element isolation region 1 at a plane of the SOI substrate SB, and insulated from the source/drain region 6, the extension region 7, and the p-type well 13 formed in the silicon layer 4 shown in FIG. 30.

The manufacturing method of the semiconductor device described in this embodiment may be applied not only to the manufacturing method of the first embodiment, but also to the manufacturing method of the third or fifth embodiment.

Seventh Embodiment

This embodiment is a modified example of the manufacturing method described in the fifth embodiment, and differs from the fifth embodiment in that the insulating film 5 in a region where the contact hole CH2 is to be formed is previously removed.

Figure 28:
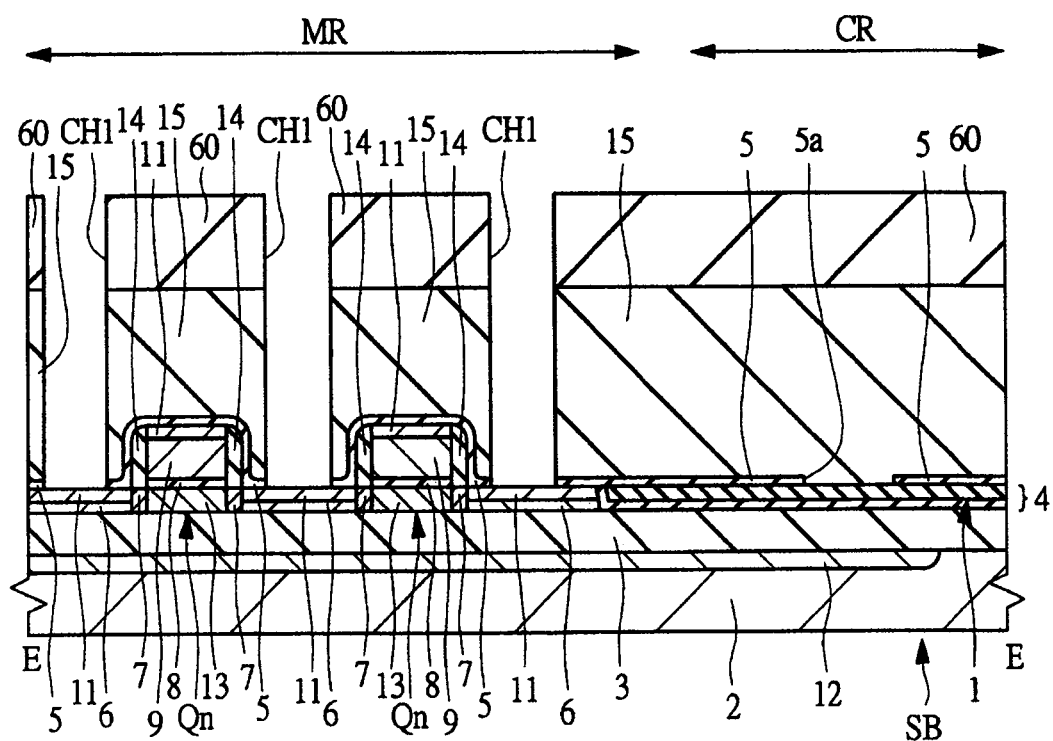
FIG. 28 is a cross-sectional view taken along the line E-E of FIG. 27, while showing a manufacturing process of the semiconductor device according to a seventh embodiment of the invention.
Figure 29:
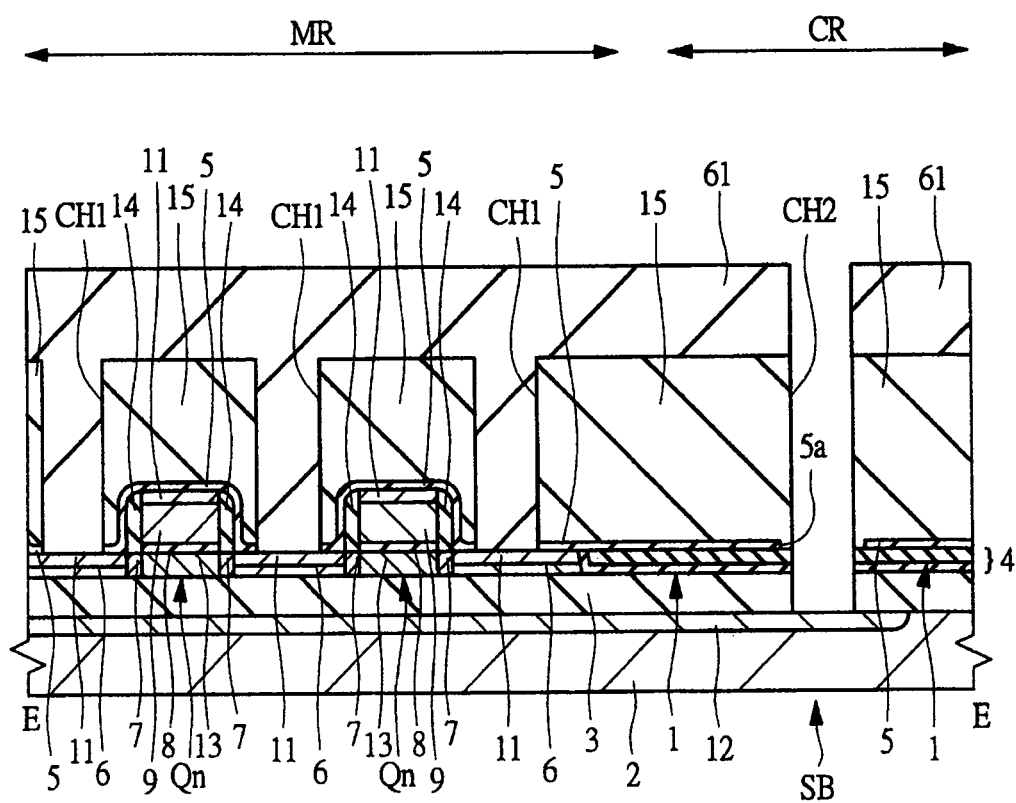
FIG. 29 is a cross-sectional view showing a manufacturing process of the semiconductor device following the process shown in FIG. 28.

Now, the manufacturing method of the semiconductor device in this embodiment will be described below using FIGS. 28 to 30. FIGS. 28 to 30 show cross-sectional views in the same position as the cross-sectional view taken along the line E-E of FIG. 27.

First, as shown in FIG. 9, the n-channel MOSFETsQn are formed over the SOI substrate SB, and the insulating film 5 is formed over the SOI substrate SB in the same processes as those described in the first embodiment with reference to FIGS. 5 to 9.

Then, as shown in FIG. 18, the insulating film 5 is partly opened to form the opening 5a in the substrate connection region CR, and the interlayer insulating film 15 is formed to cover the entire surface of the SOI substrate SB in the same processes as those described in the first embodiment with reference to FIGS. 17 and 18.

Next, as shown in FIG. 28, the photoresist film 60 is patterned over the interlayer insulating film 15 using the photolithography. The photoresist film 60 covers the interlayer insulating film 15 in the substrate connection region CR, but the upper surface of the interlayer insulating film 15 directly above the source/drain region 6 of the n-channel MOSFETQn is exposed without being covered with the photoresist film 60.

Thereafter, the contact holes CH1 are formed by the dry etching using the photoresist film 61 as a mask. The contact holes CH1 each penetrate from the upper surface of the interlayer insulating film 15 through the lower surface of the insulating film 5 to expose the upper surface of the silicide layer 11 above the source/drain region 6 and the connection portion 9b (not shown) of the gate electrode 9. As not shown in the figure, at this time, the contact holes CH3 are also formed to be coupled to the gate electrodes 9.

Then, as shown in FIG. 29, after removing the photoresist film 60, a photoresist film 61 is formed by the photolithography to cover the upper surface of the interlayer insulating film 15 except for a part of the substrate connection region CR, and to fill the contact holes CH1. At this time, a part of the upper surface of the interlayer insulating film 15 in the substrate connection region CR is exposed without being covered with the photoresist film 61.

Thereafter, the contact holes CH2 are formed by the dry etching using the photoresist film 61 as a mask. The contact holes CH2 each penetrate from the upper surface of the interlayer insulating film 15 through the lower surface of the BOX film 3 to expose the upper surface of the support substrate 2 (upper surface of the n$^+$-type semiconductor region 12). As a result, the structure shown in FIG. 24 is obtained. At this time, the insulating film 5 is previously opened before forming the contact hole CH2. When the contact hole CH2 is formed by removal using the dry etching method, the etching is performed only on an etching condition which can easily remove the interlayer insulating film 15 comprised of SiO$_2$ (silicon oxide), the element isolation region 1, and the BOX film 3, thus exposing the upper surface of the support substrate 2 (upper surface of the n$^+$-type semiconductor region 12). That is, since there is no step of removing the insulating film 5 comprised of SiN (silicon nitride) on the way towards forming the contact hole CH2, the etching condition does not need to be changed, which can simplify the manufacturing processes.

Subsequently, the photoresist film 61 is removed. The following steps are performed in the same way as in the first embodiment shown in FIGS. 13 and 14. After forming the contact plugs CT1, and CT2, the wirings 19 and 20 are formed. Thus, the manufacture of the semiconductor device of this embodiment shown in FIG. 30 is completed. As shown in FIG. 30, the source/drain region 6 is formed from the upper surface to the lower surface of the silicon layer 4. Like the semiconductor device of the first embodiment, the n-channel MOSFETQn of this embodiment is of a fully-depleted type in which a depletion layer extends from the upper surface to the lower surface of the p-type well 13 during operation.

The manufacturing process of the semiconductor device in this embodiment differs from the first and second embodiments in that the use of the photoresist films 60 and 61 shown in FIGS. 28 and 29 forms the contact holes CH1 and CH2 in different steps. In this embodiment, the contact hole CH1 is covered with the photoresist film 61 in forming the contact hole CH2, which can prevent the damage on the silicide layer 11 due to the dry etching.

Like the second embodiment, the insulating film 5 is previously opened before forming the contact hole CH2, which can simplify the etching process in forming the contact hole CH2. Thus, the semiconductor device can be manufactured in a minimum number of steps.

The manufacture method of this embodiment has been described with reference to the cross-sectional view taken along the line E-E shown in FIG. 27 of the sixth embodiment. The manufacture method of this embodiment can be obviously applied to the layout shown of the first embodiment shown in FIG. 3, the layout shown of the second embodiment shown in FIG. 16, and the layout shown of the fourth embodiment shown in FIG. 22.

The invention made by the inventors has been specifically described based on the preferred embodiments, but is not limited to the embodiments disclosed therein. It is apparent that various changes and modifications can be made to the embodiments without departing from the spirit and scope of the invention.

For example, as described in the first embodiment, p-type channel MOSFETs, or a combination of the n-channel MOSFETs and the p-channel MOSFETs may be disposed in the switches of the second to seventh embodiments. In this case, for example, over the semiconductor chip CP shown in FIG. 1, all MOSFETs of the respective switches SW1 and SW3 are the p-channel MOSFETs, and all MOSFETS of the respective switches SW2 and SW4 are the n-channel MOSFETs, whereby a combination of the p-channel MOSFET and the n-channel MOSFET does not exist in each switch.

In the first embodiment, the gate electrode is electrically coupled to the support substrate, the gate electrode is controlled to have the same potential as that of the support substrate. Alternatively, the gate electrode may not be electrically coupled to the support substrate, and the potentials of the gate electrode and of the support substrate may be independently controlled.

The invention is widely applied to semiconductor devices with semiconductor elements formed over the SOI substrate.

What is claimed is:

1. A manufacturing method of a semiconductor device including a field-effect transistor formed over a semiconductor substrate with an SOI structure, comprising the steps of:
   (a) preparing the semiconductor substrate including a support substrate, an insulating layer formed over the support substrate, and a semiconductor layer formed over the insulating layer;
   (b) after the step (a), forming an element isolation region at a main surface of the semiconductor substrate;
   (c) after the step (b), forming a first impurity diffusion layer of a first conduction type over an upper surface of the support substrate by implanting impurities of the first conduction type from the main surface of the semiconductor substrate into the main surface of the semiconductor substrate, the first impurity diffusion layer having a lower resistance than that of the support substrate;
   (d) after the step (b), forming a second impurity diffusion layer of a second conduction type in the semiconductor layer by implanting impurities of a second conduction type from the main surface of the semiconductor substrate into the main surface of the semiconductor substrate,
   (e) after the steps (c) and (d), forming the field-effect transistors including a gate electrode and source/drain regions of the first conduction type over an upper surface of the semiconductor layer;
   (f) after the step (e), forming a silicide layer over a surface of each of the gate electrode and the source/drain regions;
   (g) after the step (f), forming a first insulating film over the main surface of the semiconductor substrate so as to cover the main surface of the semiconductor substrate including the element isolation region, the gate electrode, the source/drain region, and the silicide layer,
   (h) after the step (g), forming a second insulating film over the first insulating film,
   (i) after the step (h), respectively forming a first contact hole for exposing an upper surface of the silicide layer located over each of the source/drain regions and the gate electrode, and a second contact hole for exposing an upper surface of the first impurity diffusion layer directly under the element isolation region by etching; and
   (j) after the step (i), respectively forming connection portions in the first and second contact holes,
   wherein in the step (i), the first and second contact holes are formed in the same etching step,
   wherein after the step (g) and before the step (h), a part of the first insulating film formed over the element isolation region is removed and an opening formed by removing the part of the first insulating film has a diameter in a direction along the main surface of the semiconductor substrate larger than that, in the same direction, of the second contact hole formed in the step (i),
   wherein in the step (i), an upper surface of the element isolation region in an area where the second contact hole is to be formed is exposed,
   wherein in the step (i), the second contact hole is formed to pass through an area where the first insulating film is to be removed, and
   wherein in the step (i), in the etching to form the second contact hole, the first insulating film is not removed.

2. The manufacturing method of a semiconductor device according to claim 1, wherein in the step (i), the first insulating film and the silicide layer are used as an etching stopper film.

3. The manufacturing method of a semiconductor device according to claim 1, wherein in the step (e), the silicide layer containing $CoSi_2$ is formed over the upper surface of each of the gate electrode and the source/drain regions, and
   wherein in the step (g), the first insulating film containing SiN is formed over the main surface of the semiconductor substrate.

4. A manufacturing method of a semiconductor device including a field-effect transistor formed over a semiconductor substrate with an SOI structure, comprising the steps of:
   (a) preparing the semiconductor substrate including a support substrate, an insulating layer formed over the support substrate, and a semiconductor layer formed over the insulating layer;
   (b) after the step (a), forming an element isolation region at a main surface of the semiconductor substrate;
   (c) after the step (b), forming a first impurity diffusion layer of a first conduction type over an upper surface of the support substrate by implanting impurities of the first conduction type from the main surface of the semiconductor substrate into the main surface of the semiconductor substrate, the first impurity diffusion layer having a lower resistance than that of the support substrate;
   (d) after the step (b), forming a second impurity diffusion layer of a second conduction type in the semiconductor layer by implanting impurities of the second conduction type from the main surface of the semiconductor substrate into the main surface of the semiconductor substrate,
   (e) after the steps (c) and (d), forming the field-effect transistors including a gate electrode and source/drain regions of the first conduction type over an upper surface of the semiconductor layer;
   (f) after the step (e), forming a first insulating film over a main surface of the semiconductor substrate so as to cover the main surface of the semiconductor substrate including the element isolation region, the gate electrode, and the source/drain region;
   (g) after the step (f), forming a second insulating film over the first insulating film;
   (h) after the step (g), forming a first contact hole reaching an upper surface of each of the gate electrode and the source/drain region from an upper surface of the second insulating film by etching to expose the upper surface of each of the gate electrode and the source/drain region;
   (i) after the step (g), forming a second contact hole reaching an upper surface of the support substrate directly under the element isolation region from the upper surface of the second insulating film by etching to expose an upper surface of the first impurity diffusion layer directly under the element isolation region; and
   (j) after the steps (h) and (i), respectively forming connection portions in the first and second contact holes,
   wherein the first and second contact holes are formed in different steps,
   wherein after the step (q) and before the step (h), a part of the first insulating film formed over the element isolation region is removed and an opening formed by removing the part of the first insulating film has a diameter in a direction along the main surface of the semiconductor substrate larger than that, in the same direction, of the second contact hole formed in the step (i),
   wherein in the step (i), an upper surface of the element isolation region in an area where the second contact hole is to be formed is exposed, and wherein in the step (i), the second contact hole is formed to pass through an area where the first insulating film is to be removed, and wherein in the step (i), in the etching to form the second contact hole, the first insulating film is not removed.

5. The manufacturing method of a semiconductor device according to claim 4, wherein in the step (e), a silicide layer containing $CoSi_2$ is formed over an upper surface of each of the gate electrode and the source/drain region, and wherein in the step (g), the first insulating film containing SiN is formed over the main surface of the semiconductor substrate.

\* \* \* \* \*